(12) United States Patent
Liu et al.

(10) Patent No.: US 10,804,347 B2
(45) Date of Patent: Oct. 13, 2020

(54) DISPLAY PANEL

(71) Applicant: INT TECH CO., LTD., Hsinchu County (TW)

(72) Inventors: Yu-Chen Liu, Hsinchu County (TW); Li-Chen Wei, Taichung (TW); Huei-Siou Chen, Taipei (TW)

(73) Assignee: INT TECH CO., LTD., Hsinchu County (TW)

( * ) Notice: Subject to any disclaimer, the term of this patent is extended or adjusted under 35 U.S.C. 154(b) by 0 days.

(21) Appl. No.: 16/701,084

(22) Filed: Dec. 2, 2019

(65) Prior Publication Data

US 2020/0105846 A1    Apr. 2, 2020

Related U.S. Application Data

(63) Continuation-in-part of application No. 15/703,469, filed on Sep. 13, 2017, now Pat. No. 10,527,878.

(51) Int. Cl.
*G02F 1/1335* (2006.01)
*H01L 27/32* (2006.01)
(Continued)

(52) U.S. Cl.
CPC ........ *H01L 27/3246* (2013.01); *G02F 1/1337* (2013.01); *G02F 1/133528* (2013.01);
(Continued)

(58) Field of Classification Search
CPC .................................................. G02F 1/133502
See application file for complete search history.

(56) References Cited

U.S. PATENT DOCUMENTS

| 2006/0232195 A1* | 10/2006 | Cok | ................ H01L 51/5265 |
| | | | 313/504 |
| 2012/0088037 A1* | 4/2012 | Oki | .................... G02B 5/208 |
| | | | 427/553 |

(Continued)

FOREIGN PATENT DOCUMENTS

| CN | 102842271 A | 12/2012 |
| CN | 103715219 A | 4/2014 |

OTHER PUBLICATIONS

Office Action and Search Report dated May 7, 2020 issued by China National Intellectual Property Administration for counterpart application No. 201711165061.3.

(Continued)

*Primary Examiner* — Sang V Nguyen
(74) *Attorney, Agent, or Firm* — WPAT, P.C., Intellectual Property Attorneys; Anthony King

(57) ABSTRACT

A display panel includes a display device, a light-guiding structure and an anti-reflection structure. The light-guiding structure is disposed between the pixels to guide light beams emitted from the pixels toward a display surface. The anti-reflection structure is over the pixels of the display device, wherein the anti-reflection structure includes a photo-sensitive alignment layer, a liquid crystal circular polarizer and a linear polarizer. The photo-sensitive alignment layer is over the optical absorbing layer, wherein the photo-sensitive alignment layer is sensitive to and curable by the light within the wavelength range. The liquid crystal circular polarizer is over the photo-sensitive alignment layer, wherein the liquid crystal circular polarizer includes a plurality of liquid crystal molecules aligned by the photo-sensitive alignment layer. The linear polarizer is over the liquid crystal circular polarizer.

6 Claims, 23 Drawing Sheets

(51) Int. Cl.
*G02F 1/1337* (2006.01)
*H01L 51/52* (2006.01)

(52) U.S. Cl.
CPC ...... *H01L 51/5206* (2013.01); *H01L 51/5221* (2013.01); *H01L 51/5268* (2013.01); *H01L 51/5271* (2013.01); *H01L 51/5275* (2013.01); *G02F 2001/133541* (2013.01); *G02F 2201/38* (2013.01); *G02F 2203/023* (2013.01); *G02F 2203/03* (2013.01)

(56) References Cited

U.S. PATENT DOCUMENTS

| | | | | |
|---|---|---|---|---|
| 2012/0327336 | A1* | 12/2012 | Jeon | H01L 51/5281 349/102 |
| 2014/0098513 | A1* | 4/2014 | Yi | G02B 5/003 362/19 |
| 2015/0064367 | A1* | 3/2015 | Choi | G02B 5/3041 428/1.31 |
| 2015/0116834 | A1* | 4/2015 | Osumi | G02F 1/133502 359/601 |
| 2015/0277012 | A1* | 10/2015 | Nakamura | G02B 5/045 349/96 |
| 2016/0104869 | A1* | 4/2016 | Choi | H01L 51/5246 257/40 |
| 2016/0245956 | A1* | 8/2016 | Kodama | G02B 5/3033 |
| 2016/0325113 | A1* | 11/2016 | Khan | A61N 5/062 |
| 2017/0104182 | A1* | 4/2017 | Kim | H01L 27/322 |
| 2017/0271420 | A1* | 9/2017 | Tsai | H01L 27/32 |
| 2017/0294624 | A1* | 10/2017 | Xu | H01L 27/3244 |
| 2017/0294628 | A1* | 10/2017 | Kim | H01L 51/5253 |
| 2017/0336546 | A1* | 11/2017 | Ohyama | H01L 51/5265 |

OTHER PUBLICATIONS

US Patent Publication 20120327336 is the counterpart application to Foreign Reference CN 102842271 A.
US Patent Publication 20140098513 is the counterpart application to Foreign Reference CN 103715219 A.

* cited by examiner

DISPLAY PANEL

CROSS-REFERENCE TO RELATED APPLICATIONS

This application is a continuation-in-part application of a U.S. patent application entitled DISPLAY PANEL AND METHOD FOR MANUFACTURING THE SAME, Ser. No. 15/703,469, filed Sep. 13, 2017, now allowed, which is incorporated by reference in its entirety.

TECHNICAL FIELD

The present disclosure is related to a display panel, especially to an organic light-emitting diode display panel.

BACKGROUND

A display panel such as an organic light-emitting diode (OLED) display panel has been incorporated in various electronic devices such as smart phones to provide display function. The display panel, however, suffers from ambient light reflection in outdoor use, which deteriorates visibility of the display panel.

SUMMARY

Embodiments of the present disclosure provide a display panel including a display device, an optical absorbing layer, an anti-reflection structure and a cover layer. The display device includes a plurality of pixels. The optical absorbing layer is over the display device and configured to absorb a light within a wavelength range. The anti-reflection structure is over the pixels of the display device, wherein the anti-reflection structure includes a photo-sensitive alignment layer, a liquid crystal circular polarizer and a linear polarizer. The photo-sensitive alignment layer is over the optical absorbing layer, wherein the photo-sensitive alignment layer is sensitive to and curable by the light within the wavelength range. The liquid crystal circular polarizer is over the photo-sensitive alignment layer, wherein the liquid crystal circular polarizer includes a plurality of liquid crystal molecules aligned by the photo-sensitive alignment layer. The linear polarizer is over the liquid crystal circular polarizer. The cover layer is over the ti-reflection structure.

In some embodiments, the optical absorbing layer is configured to absorb an invisible light.

In some embodiments, the optical absorbing layer comprises a UV light absorbing layer, and the wavelength range is substantially between 200 nm and 400 nm.

In some embodiments, the liquid crystal circular polarizer is configured as a ¼ wavelength retardation layer.

In some embodiments, the display device includes an organic light-emitting diode (OLED) device, and each of the pixels includes an anode, an organic light-emitting layer over the anode, and a cathode over the organic light-emitting layer.

In some embodiments, the photo-sensitive alignment layer has a curing temperature lower than a glass transition temperature of the organic light-emitting layer.

In some embodiments, the display panel further includes a thin film encapsulation between the display device and the optical absorbing layer.

In some embodiments, the display panel further includes a touch input device between the display device and the cover layer.

In some embodiments, the display panel further includes at least one anti-reflection layer between the display device and the cover layer.

In some embodiments, the anti-reflection layer is between the linear polarizer and the cover layer.

In some embodiments, the anti-reflection layer is between the optical absorbing layer and the display device.

In some embodiments, the anti-reflection layer comprises a structural layer including a plurality of protrusion structures opposite to the linear polarizer.

In some embodiments, the anti-reflection layer further comprises an optical layer in contact with the structural layer, and a surface of the optical layer is engaged with the protrusion structures.

In some embodiments, a refractive index of the optical layer is smaller than a refractive index of the structural layer.

Embodiments of the present disclosure provide a display penal including an organic light-emitting diode (OLED) device and an anti-reflection structure. The OLED device includes a plurality of pixels, wherein each of the pixels includes an anode, an organic light-emitting layer over the anode, and a cathode over the organic light-emitting layer. The organic light-emitting layer has a glass transition temperature. The anti-reflection structure is over the pixels of the OLED device, wherein the anti-reflection structure includes a photo-sensitive alignment layer, a liquid crystal circular polarizer, and a linear polarize. The photo-sensitive alignment layer is over the OLED device, wherein the photo-sensitive alignment layer has a curing temperature lower than the glass transition temperature of the organic light-emitting layer. The liquid crystal circular polarizer is over the photo-sensitive alignment layer, wherein the liquid crystal circular polarizer includes a plurality of liquid crystal molecules aligned by the photo-sensitive alignment layer and configured as a wavelength retardation layer. The linear polarizer is over the liquid crystal circular polarizer.

In some embodiments, the display panel further includes an optical absorbing layer over the OLED device.

Embodiments of the present disclosure provide a method for manufacturing a display panel. The method includes forming an organic light-emitting diode (OLED) device comprising an organic light-emitting layer, wherein the organic light-emitting layer has a glass transition temperature; forming a photo-sensitive material over the OLED device; and heating the photo-sensitive material at a curing temperature, wherein the curing temperature of the photo-sensitive material is lower than the glass transition temperature of the organic light-emitting layer. The method further includes irradiating the photo-sensitive material with a light to form a photo-sensitive alignment layer; forming a plurality of liquid crystal molecules over the photo-sensitive alignment layer, the liquid crystal molecules being aligned by the photo-sensitive alignment layer to form a liquid crystal circular polarizer; and forming a linear polarizer over the liquid crystal circular polarizer.

In some embodiments, the method further includes forming an optical absorbing layer over the OLED device prior to the forming the photo-sensitive material over the display device.

In some embodiments, the light is a linear polarizing invisible light.

In some embodiments, the linear polarizing invisible light is a linear polarizing UV light having a wavelength range substantially between 200 nm and 400 nm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
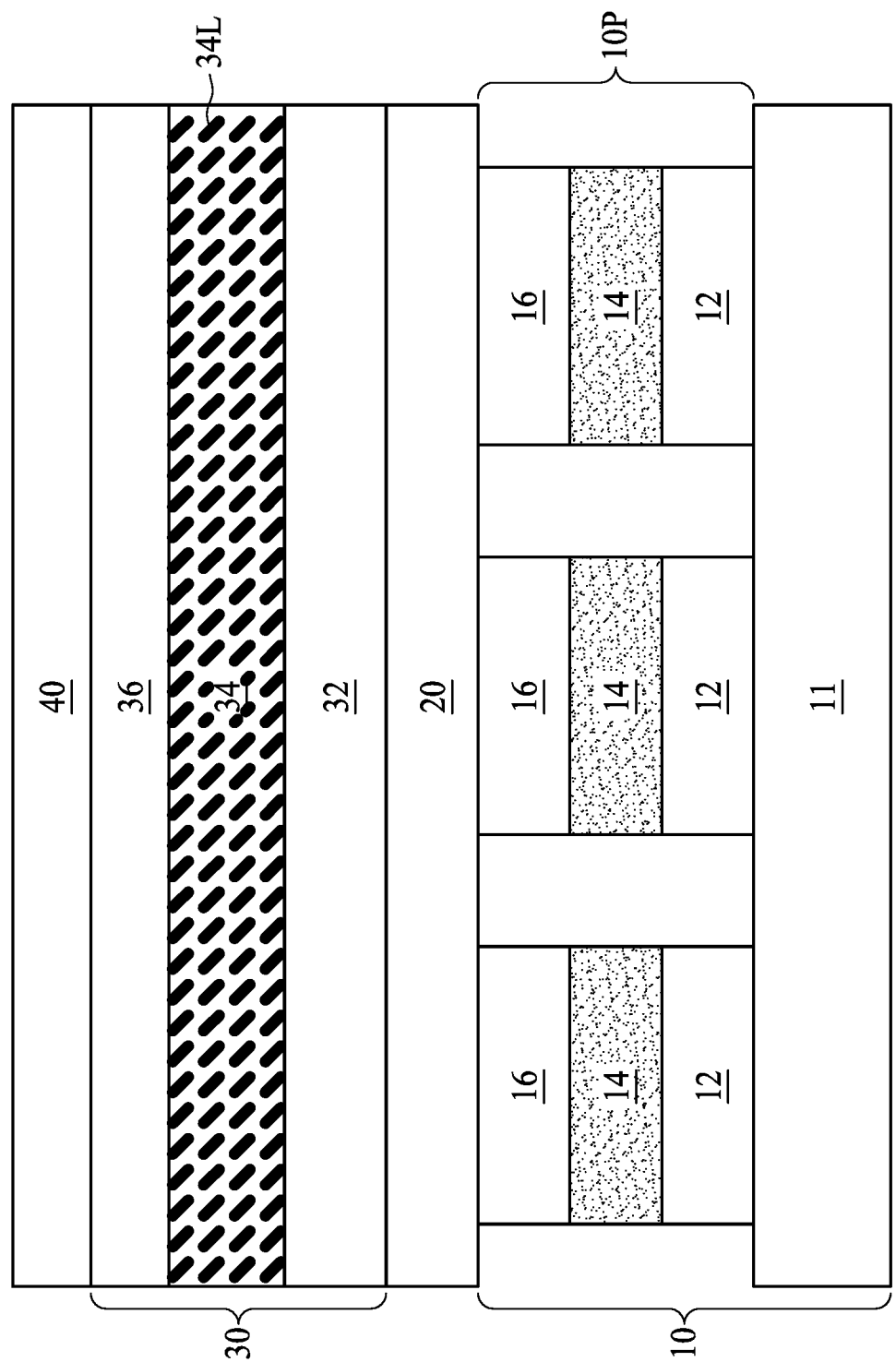
FIG. 1 is a schematic diagram of a display panel in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

Further, spatially relative terms, such as "beneath," "below," "lower," "above," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second" and "third" when used herein do not imply a sequence or order unless clearly indicated by the context.

In some embodiments of the present disclosure, a display panel such as an OLED display panel including an integrally-formed anti-reflection structure is provided. The integrally-formed anti-reflection structure can be directly formed on the display surface of the display panel without damaging the display device such as OLED device and without requiring additional adhesive layers, and thus can save manufacturing costs, minimize the overall thickness of the display panel and increase adhesion. The integrally-formed anti-reflection structure can inhibit reflection of incident light from the environment, and thus can increase visibility and contrast ratio in outdoor use.

FIG. 1 is a schematic diagram of a display panel in accordance with some embodiments of the present disclosure. As shown in FIG. 1, the display panel 1 includes a display device 10, an anti-reflection structure 30 and a cover layer 40. In some embodiments, the display panel 1 may include an electroluminescent display panel such as an OLED display panel. In some embodiments, the display device 10 may include a plurality of pixels 10P formed over a substrate 11. The substrate 11 may include a rigid substrate such as a glass substrate, or a flexible substrate such as a plastic substrate. In some embodiments, circuitries such as driving circuits may be formed on the substrate 10. Each of the pixels 10 may include an anode 12, an organic light-emitting layer 14 and a cathode 16. The anode 12 may be formed over the substrate 11, and electrically connected to the driving circuits. The organic light-emitting layer 14 may be formed over the anode 12. The cathode 16 may be formed over the organic light-emitting layer 14, and electrically connected to the driving circuits. In some embodiments, the anodes 12, the organic light-emitting layers 14 and the cathodes 16 may be formed on the substrate 11 by deposition, photolithography and etching techniques, and thus the resolution of the display device 10 can be increased. The anode 12 and the cathode 16 may be formed from transparent conductive material such as indium tin oxide (ITO) or metal material with thin thickness. In some embodiments, the display device 10 may include a flexible display device or a bendable display panel. In such a case, the anode 12 and the cathode 16 may be formed from conductive material with good ductility and malleability such as thin metal.

The anti-reflection structure 30 is disposed over the pixels 10P of the display device 10, and configured to inhibit reflection of incident ambient light and to pass the lights emitted from the pixels 10P, so that the contrast ratio of the display panel 1 in outdoor environment is improved. In some embodiments, the anti-reflection structure 30 may be integrally formed over the display device 10 without requiring additional adhesive layer. In some embodiments, the anti-reflection structure 30 may include a photo-sensitive alignment layer 32, a liquid crystal circular polarizer 34 and a linear polarizer 36. In some embodiments, the photo-sensitive alignment layer 32 is disposed over the display device 10. In some embodiments, the photo-sensitive alignment layer 32 may be formed from a photo-sensitive material such as a polyimide-based material. The photo-sensitive alignment layer 32 is sensitive to and curable by a light within a wavelength range. In some embodiments, the photo-sensitive alignment layer 32 is sensitive to an invisible light such as a UV light, and the light is within the wavelength range between 200 nm and 400 nm, but not limited thereto. In some embodiments, the photo-sensitive material may be thermally cured to be solidified at a curing temperature. In some embodiments, the curing temperature of the photo-sensitive material is lower than the glass transition temperature of the organic light-emitting layers 14 such that the organic light-emitting layers 14 is not damaged. For example, the curing temperature of the photo-sensitive alignment layer 32 is substantially lower than 110° C., such as between about 50° C. and about 80° C., but not limited thereto.

In some embodiments, the display panel 1 may optionally include an optical absorbing layer 20 disposed over the display device 10 and configured to absorb the light for curing the photo-sensitive alignment layer 32. The optical absorbing layer 20 may be integrally formed over the display panel 1. The installation of the optical absorbing layer 20 may prevent the display device 10, particularly the organic light-emitting layers 14, from being damaged by exposure to the light for curing the photo-sensitive alignment layer 32. In some embodiments, the optical absorbing layer 20 is configured to absorb an invisible light. By way of example, the optical absorbing layer includes a UV light absorbing layer, and the wavelength range is substantially between 200 nm and 400 nm.

The liquid crystal circular polarizer 34 is disposed over the photo-sensitive alignment layer 32. The liquid crystal circular polarizer 34 includes a plurality of liquid crystal molecules 34L aligned by the photo-sensitive alignment layer 32. In some embodiments, the material of the photo-sensitive alignment layer 32 may be decomposed by optical irradiation, and the decomposed material may be bonded to liquid crystal molecules 34L so as to align the liquid crystal molecules 34L. The aligned liquid crystal molecules 34L therefore can provide phase retardation effect. In some embodiments, the liquid crystal circular polarizer 34 is configured as a ¼ wavelength retardation layer. In some embodiments, the liquid crystal molecules 34L may include smectic liquid crystal molecules, nematic liquid crystal molecules, cholesteric liquid crystal molecules, disk-like liquid crystal molecules, rod-like liquid crystal molecules, or other suitable liquid crystal molecules.

The linear polarizer 36 is disposed over the liquid crystal circular polarizer 34. In some embodiments, the linear polarizer 36 may be in contact with the liquid crystal circular polarizer 34, and may be integrally formed over the liquid crystal circular polarizer 34. The linear polarizer 36 is configured to let a light of a specific linear polarization pass and filter a light of another specific linear polarization. The linear polarizer 36 in conjunction with the liquid crystal circular polarizer 34 is configured as the anti-reflection structure 30 to inhibit incident ambient light.

In some embodiments, the cover layer 40 is disposed over the anti-reflection structure 30. The cover layer 40 is configured as a protection layer to protect the display panel 1. In some embodiments, the cover layer 40 may include a plastic layer, but is not limited thereto.

In some embodiments, other functional layer(s) configured to provide other functions may be integrally formed over the display device 10.

Figure 2:
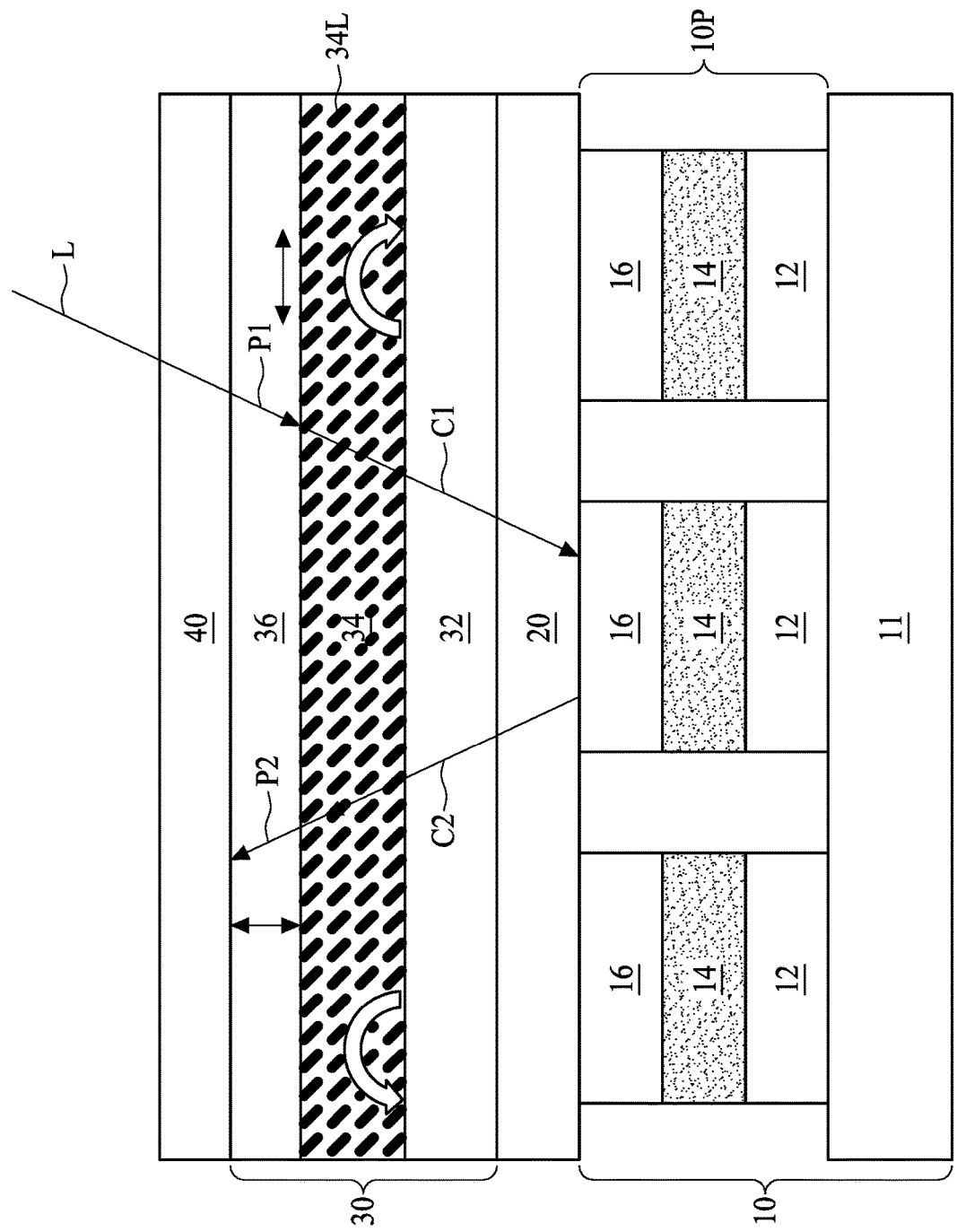
FIG. 2 is a schematic diagram illustrating a light path of an incident ambient light of a display panel in accordance with some embodiments of the present disclosure.

FIG. 2 is a schematic diagram illustrating a light path of an incident ambient light of a display panel in accordance with some embodiments of the present disclosure. As illustrated in FIG. 2, a portion of an incident ambient light L passes through the linear polarizer 36, and becomes a first linear polarizing light P1 such as a horizontal polarizing light. The first linear polarizing light P1 then passes through the liquid crystal circular polarizer 34, and is retarded by ¼ wavelength to become a first circular polarizing light C1 such as right circular polarizing light. The first circular polarizing light C1 is then reflected by the cathodes 16 or the anodes 12 of the display device 10, and the polarization of the first circular polarizing light C1 is inversed to become a second circular polarizing light C2 such as a left circular polarizing light. The second circular polarizing light C2 then passes through the liquid crystal circular polarizer 34, and is retarded by ¼ wavelength to become a second linear polarizing light P2 such as a vertical polarizing light. The second linear polarizing light P2 is filtered by the linear polarizer 36, and thus will not exit. Accordingly, reflection of the incident ambient light L is inhibited.

The display panel of the present disclosure is not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
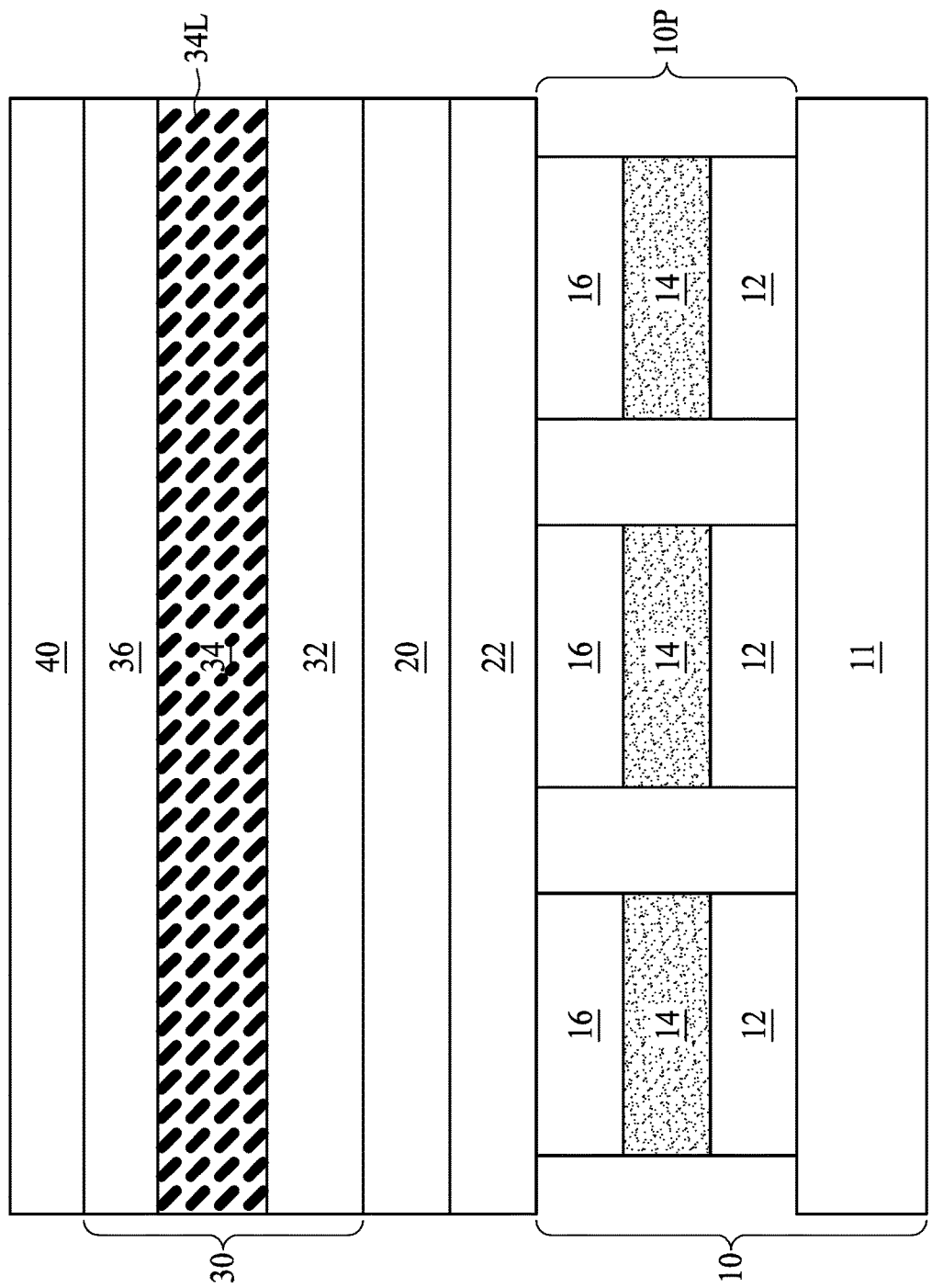
FIG. 3 is a schematic diagram of a display panel in accordance with some embodiments of the present disclosure.

FIG. 3 is a schematic diagram of a display panel in accordance with some embodiments of the present disclosure. As shown in FIG. 3, in contrast to the display panel 1 of FIG. 1, the display panel 2 may further include a thin film encapsulation (TFE) 22 disposed between the display device 10 and the anti-reflection structure 30 such as between the display device 10 and the optical absorbing layer 20. The TFE 22 is configured to encapsulate the display device 10 from being exposed to moisture, oxygen or the like, such that the lifetime of the display panel 2 can be extended. In some embodiments, the TFE 22 may be integrally formed over the display device 10. In some embodiments, the TFE 22 may be a single-layered encapsulation formed from organic material or inorganic material. In some embodiments, the TFE 22 may be a multi-layered encapsulation formed from organic material and inorganic material stacked to one another. For example, the TFE 22 may include two inorganic films and one organic film sandwiched between those two inorganic films.

Figure 4:
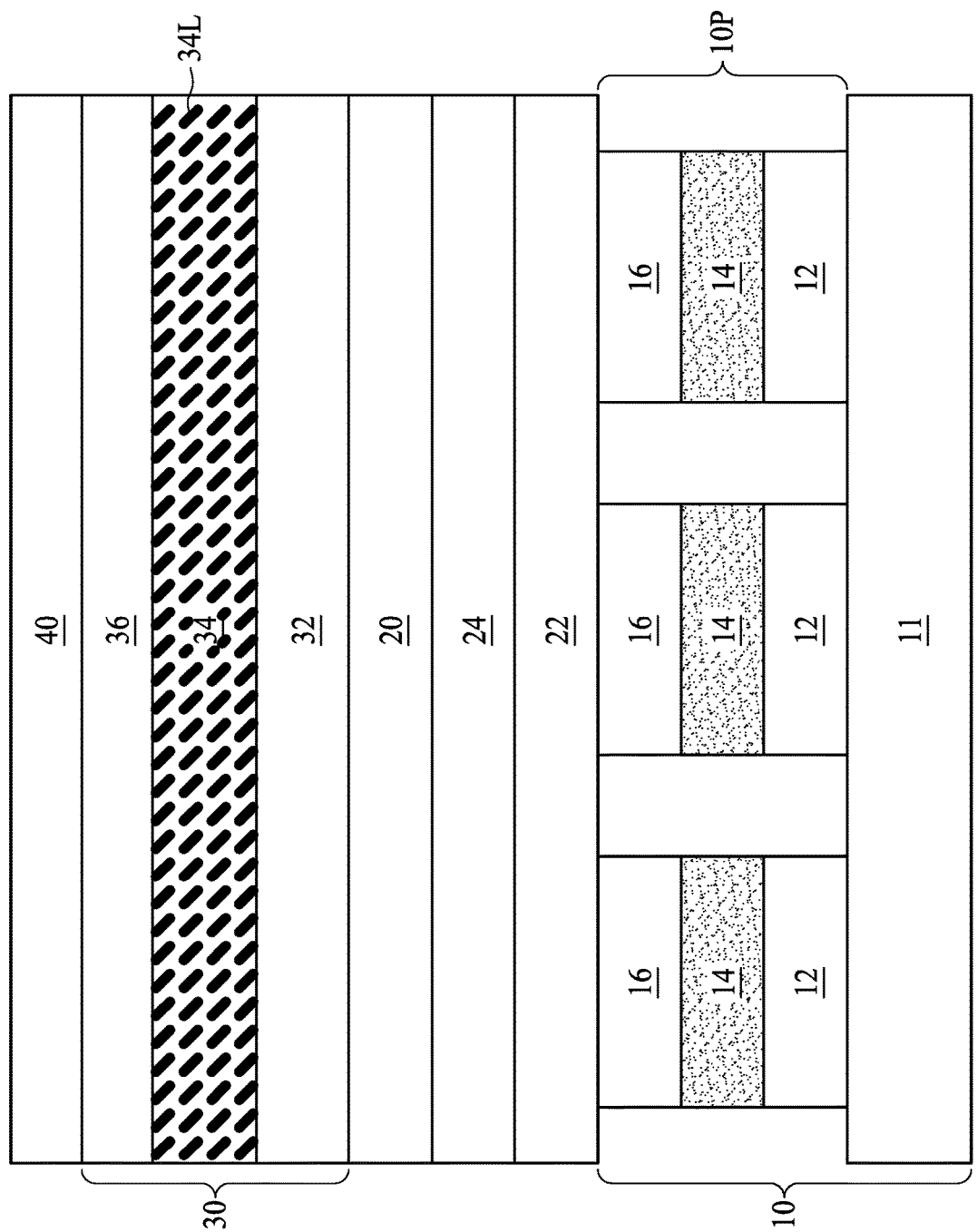
FIG. 4 is a schematic diagram of a display panel in accordance some embodiments of the present disclosure.

FIG. 4 is a schematic diagram of a display panel in accordance with some embodiments of the present disclosure. As shown in FIG. 4, in contrast to the display panel 2 of FIG. 3, the display panel 3 may further include a touch input device 24 configured to provide touch input function. In some embodiments, the touch input device 24 may be disposed between the display device 10 and the cover layer 40. In some embodiments, the touch input device 24 may be disposed between the TFE 22 and the anti-reflection structure 30, but is not limited thereto. In some embodiments, the touch input device 24 may be integrally formed over the TFE 22. In some embodiments, the touch input device 24 may include a capacitive touch input device or other types of touch input device.

Figure 5:
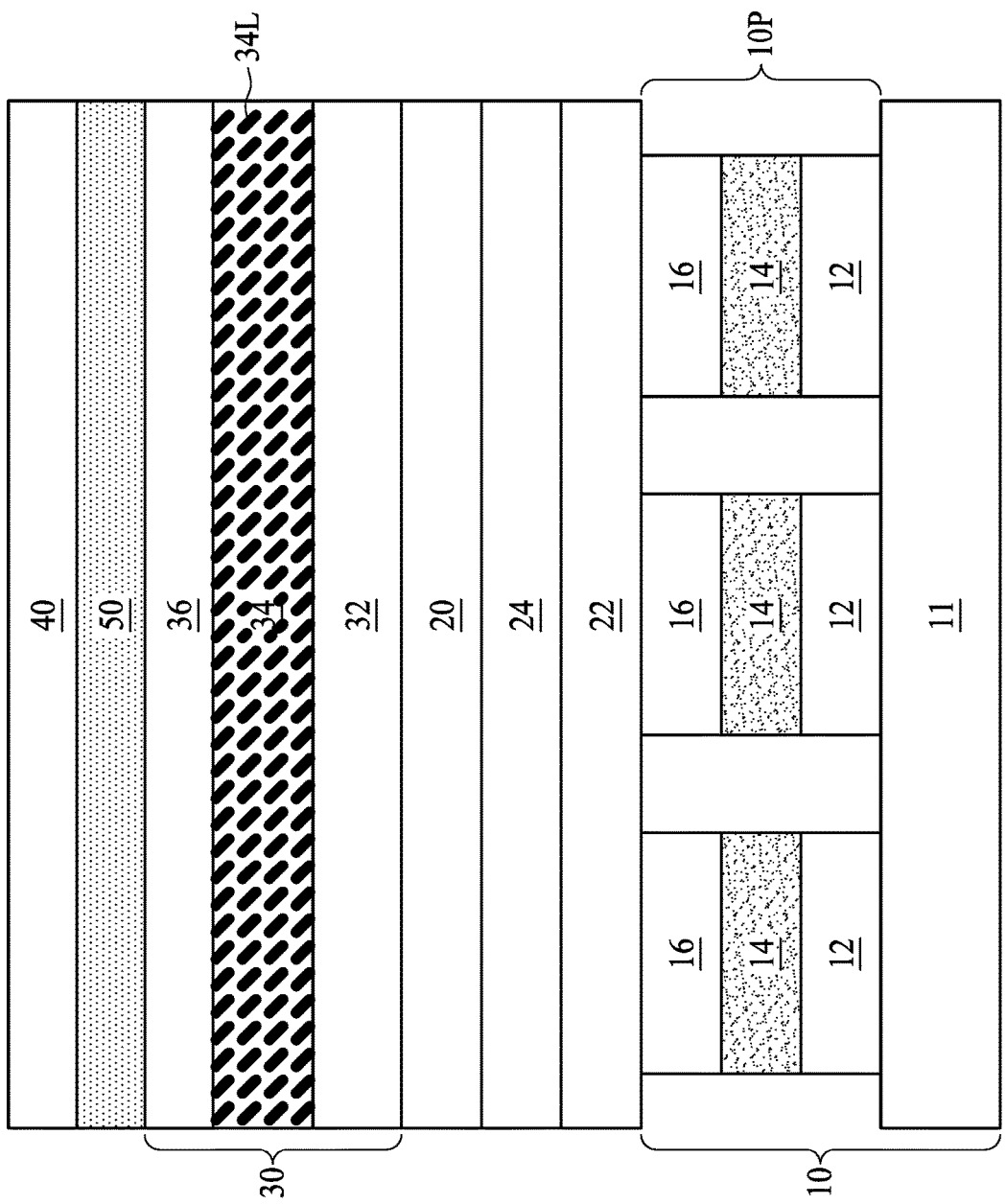
FIG. 5 is a schematic diagram of a display panel in accordance with some embodiments of the present disclosure.

FIG. 5 is a schematic diagram of a display panel in accordance with some embodiments of the present disclosure. As shown in FIG. 5, in contrast to the display panel 3 of FIG. 4, the display panel 4 may further include at least one anti-reflection layer 50 between the display device 10 and the cover layer 40. In some embodiments, the first anti-reflection layer 50 may be disposed between the linear polarizer 36 and the cover layer 40. In some embodiments, the anti-reflection layer 50 may be integrally formed over the anti-reflection structure 30. In some embodiments, the detailed structure of the anti-reflection layer 50 may be illustrated in FIG. 5A or FIG. 5B.

Figure 5A:
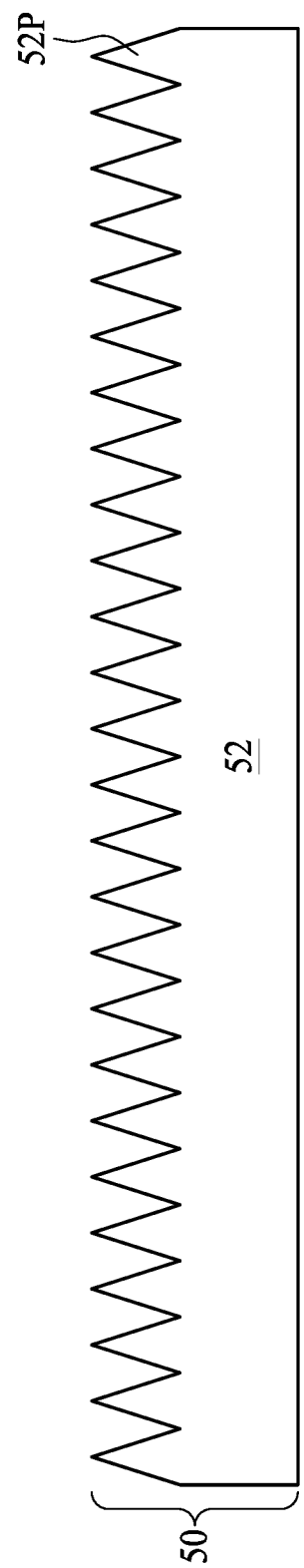
FIG. 5A is a schematic diagram of an anti-reflection layer in accordance with some embodiments of the present disclosure.

FIG. 5A is a schematic diagram of an anti-reflection layer in accordance with some embodiments of the present disclosure. As shown in FIG. 5 and FIG. 5A, the anti-reflection layer 50 may include a structural layer 52. In some embodiments, the structural layer 52 includes a plurality of protrusion structures 52P opposite to the display device 10. By way of example, the protrusion structures 52P may include moth-eye structures protruding out from the structural layer 52, and recessed structures such as valleys may be formed between adjacent moth-eye structures. In some embodiments, the protrusion structures 52P and the recessed structures are connected to one another, and no flat surface is formed between the protrusion structures 52P and the recessed structures. In some embodiments, the refractive index of the structural layer 52 is different from the refractive index of a medium interfacing the structural layer 52. In some embodiments, the refractive index of the structural layer 52 is greater than the refractive index of the medium. By way of example, the medium may include a gaseous medium such as air having a refractive index of about 1, and the structural layer 52 may be formed from a transparent material such as organic or inorganic material having a refractive index of about 1.5, but is not limited thereto.

Figure 5B:
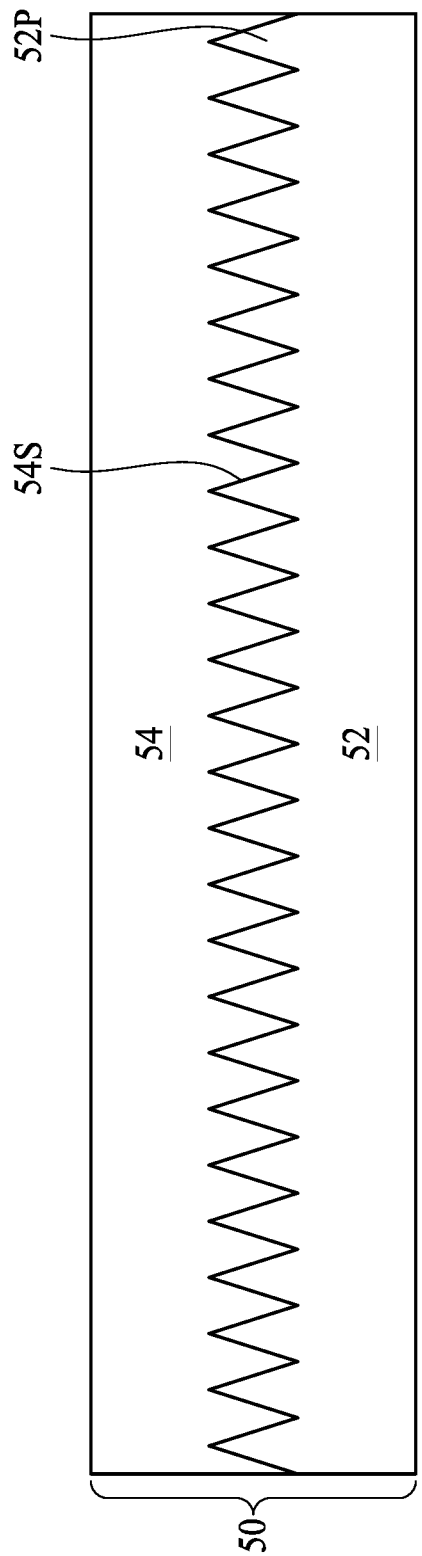
FIG. 5B is a schematic diagram of an anti-reflection layer in accordance with some embodiments of the present disclosure.

FIG. 5B is a schematic diagram of an anti-reflection layer in accordance with some embodiments of the present disclosure. As shown in FIG. 5B, the anti-reflection layer 50 may further include an optical layer 54 disposed over the structural layer 52. In some embodiments, the optical layer 54 is in contact with the structural layer 52, and a surface 54S of the optical layer 54 is engaged with the protrusion structures 52P of the structural layer 52. In some embodiments, the structural layer 52 and the optical layer 54 are formed from transparent materials such as organic or inorganic materials having different refractive indices. In some embodiments, the refractive index of the optical layer 54 is smaller than the refractive index of the structural layer 52. By way of example, the refractive index of the optical layer 54 is about 1, and the refractive index of the structural layer 52 is about 1.5, but not limited thereto.

In some embodiments, the anti-reflection layer 50 is integrally formed over the display device 10. The anti-reflection layer 50 includes protrusion structures 52P and recess structures having different refractive indices such that the effective refractive index of the anti-reflection layer 50 varies in a depth direction. In some embodiments, the effective refractive index of the anti-reflection layer 50 varies continuously in the depth direction. In some embodiments, the effective refractive index of the anti-reflection layer 50 varies discretely in the depth direction. Accordingly, reflection of incident ambient light can be further reduced. The installation of the anti-reflection layer 50 and the anti-reflection structure 30 can further enhance inhibition of reflection of incident ambient light.

Figure 6:
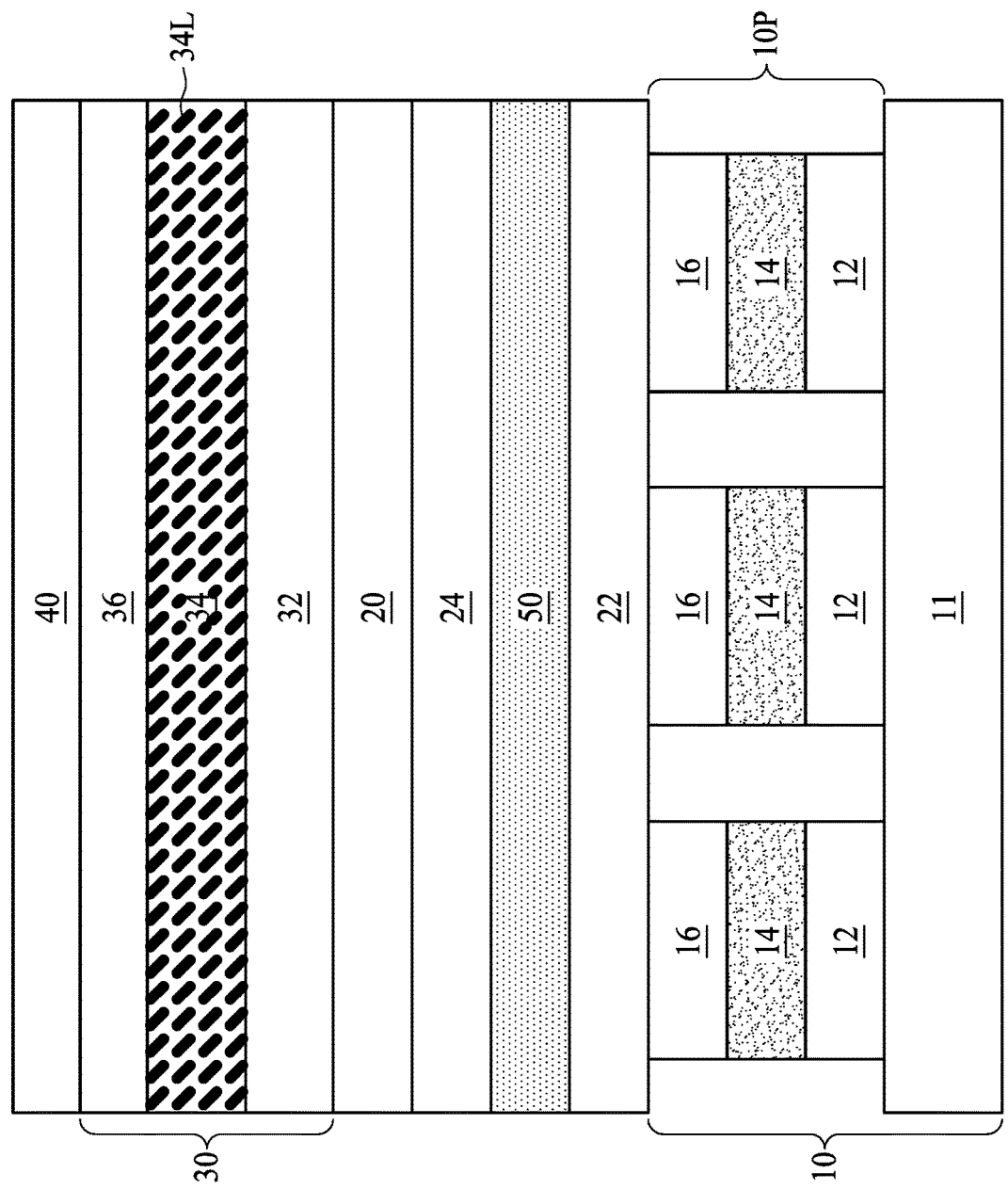
FIG. 6 is a schematic diagram of a display panel in accordance some embodiments of the present disclosure.

FIG. 6 is a schematic diagram of a display panel in accordance with some embodiments of the present disclosure. As shown in FIG. 6, in contrast to the display panel 4 of FIG. 5, the anti-reflection layer 50 of the display panel 5 may be disposed between the optical absorbing layer 20 and the display device 10. For example, the anti-reflection layer 50 may be disposed between the TFE 22 and the touch input device 24. The installation of the anti-reflection layer 50 and the anti-reflection structure 30 can further enhance inhibition of reflection of incident ambient light.

Figure 7:
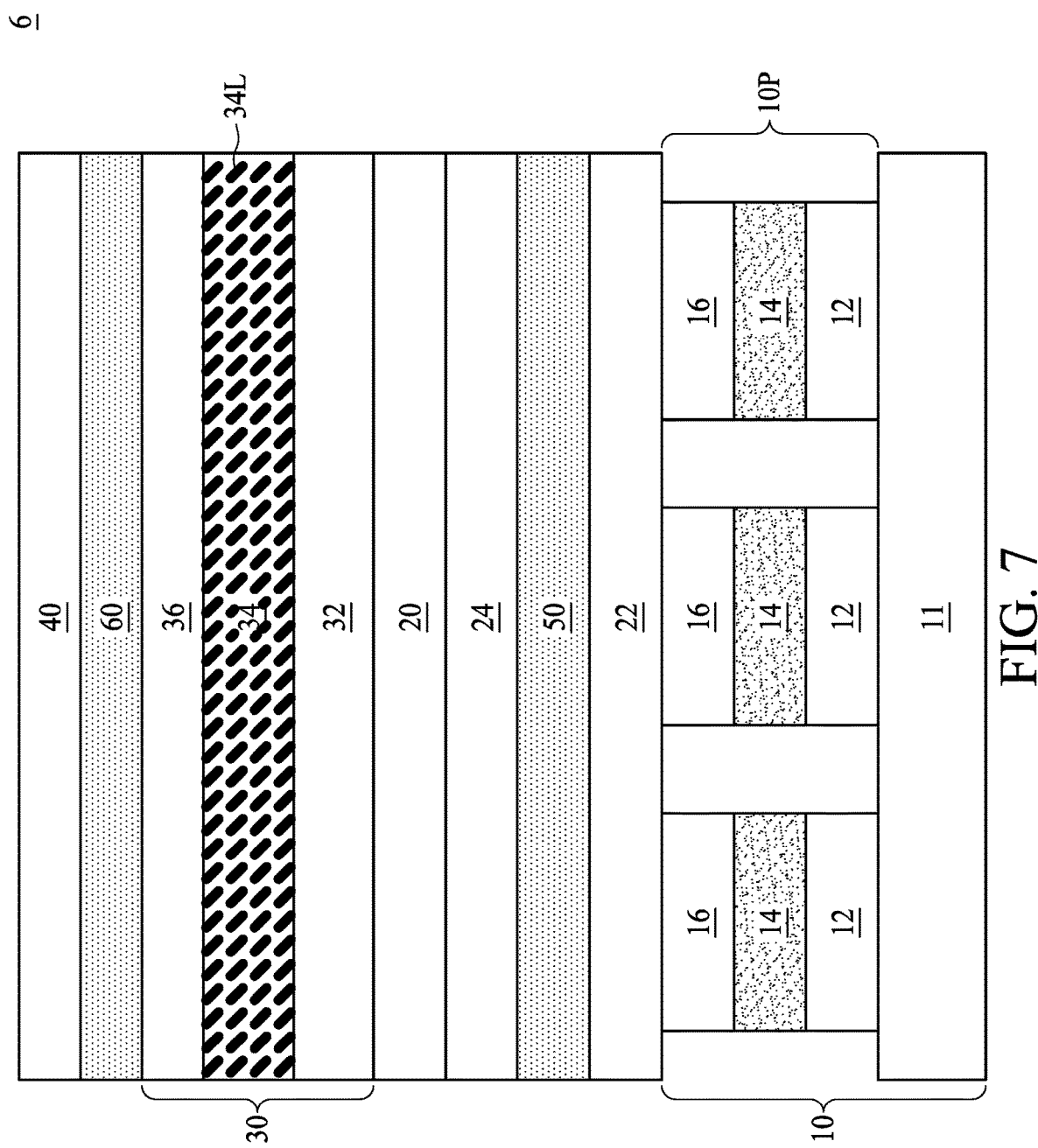
FIG. 7 is a schematic diagram of a display panel in accordance with some embodiments of the present disclosure.

FIG. 7 is a schematic diagram of a display panel in accordance with some embodiments of the present disclosure. As shown in FIG. 7, in contrast to the display panel 5 of FIG. 6, the display panel 6 may further include two anti-reflection layers 50 and 60. In some embodiments, the anti-reflection layer 50 may be disposed between the TFE 22 and the touch input device 24, and another anti-reflection layer 60 may be disposed between the linear polarizer 36 and the cover layer 40. In some embodiments, the anti-reflection layer 50 disposed proximal to the display device 10 may include detailed structure as illustrated in FIG. 5A or FIG. 5B. In some embodiments, the detailed structure of the anti-reflection layer 60 may be illustrated in FIG. 7A or FIG. 7B.

Figure 7A:
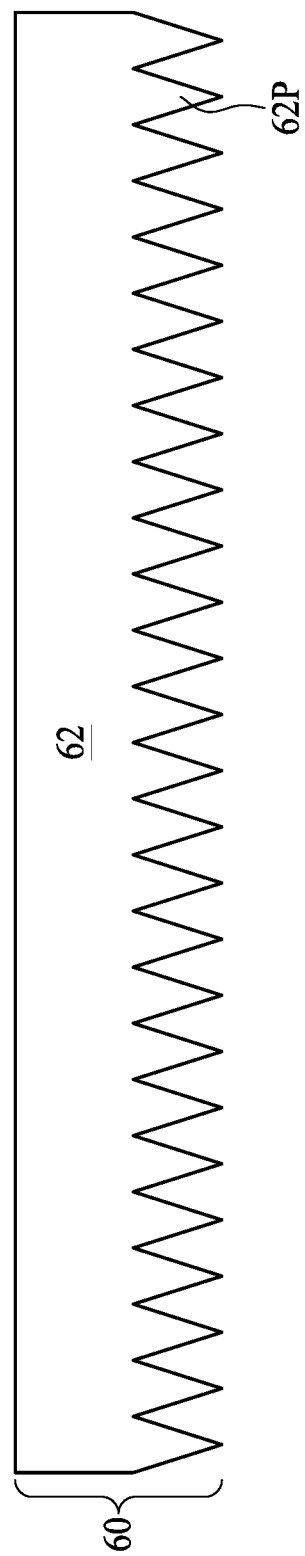
FIG. 7A is a schematic diagram of an anti-reflection layer in accordance with some embodiments of the present disclosure.

FIG. 7A is a schematic diagram of an anti-reflection layer in accordance with some embodiments of the present disclosure. As shown in FIG. 7 and FIG. 7A, the anti-reflection layer 60 may include a structural layer 62. In some embodiments, the structural layer 62 includes a plurality of protrusion structures 62P facing the display device 10. By way of example, the protrusion structures 62P may include moth-eye structures protruding out from the structural layer 62, and recessed structures such as valleys may be formed between adjacent moth-eye structures. In some embodiments, the protrusion structures 62P and the recessed structures are connected to one another, and no flat surface is formed between the protrusion structures 62P and the recessed structures. In some embodiments, the refractive index of the structural layer 62 is different from the refractive index of the medium interfacing the structural layer 62. In some embodiments, the refractive index of the structural layer 62 is greater than the refractive index of a medium. By way of example, the medium may include a gaseous medium such as air having a refractive index of about 1, and the structural layer 62 may be formed from a transparent material such as organic or inorganic material having a refractive index of about 1.5, but not limited thereto. In some embodiments, the protrusion structures 62P of the anti-reflection layer 60 and the protrusion structures 52P of the anti-reflection layer 50 face each other. For example, the protrusion structures 62P protrude toward the anti-reflection layer 50, and the protrusion structures 52P protrude toward the anti-reflection layer 60.

Figure 7B:
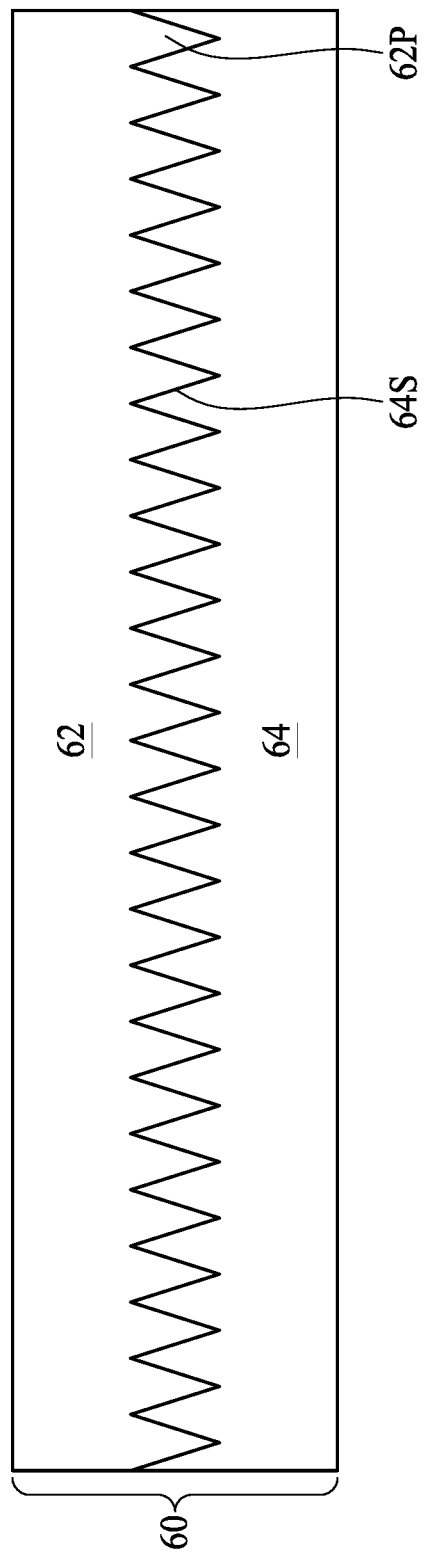
FIG. 7B is a schematic diagram of an anti-reflection layer in accordance with some embodiments of the present disclosure.

FIG. 7B is a schematic diagram of an anti-reflection layer in accordance with some embodiments of the present disclosure. As shown in FIG. 7B, the anti-reflection layer 60 may further include an optical layer 64 disposed over the structural layer 62. In some embodiments, the optical layer 64 is in contact with the structural layer 62, and a surface 64S of the optical layer 64 is engaged with the protrusion structures 62P of the structural layer 62. In some embodiments, the structural layer 62 and the optical layer 64 are formed from transparent materials such as organic or inorganic materials having different refractive indices. In some embodiments, the refractive index of the optical layer 64 is smaller than the refractive index of the structural layer 62. By way of example, the refractive index of the optical layer 64 is about 1, and the refractive index of the structural layer 62 is about 1.5, but not limited thereto. In some embodiments, the protrusion structures 62P and the protrusion structures 52P face each other. For example, the protrusion structures 62P protrude toward the anti-reflection layer 50, and the protrusion structures 52P protrude toward the anti-reflection layer 60.

In some embodiments, the anti-reflection layer 60 is integrally formed the display device 10. The anti-reflection layer 60 includes protrusion structures 62P and recess structures having different refractive indices such that the effective refractive index of the anti-reflection layer 60 varies in a depth direction. In some embodiments, the effective refractive index of the anti-reflection layer 60 varies continuously in the depth direction. In some embodiments, the effective refractive index of the anti-reflection layer 60 varies discretely in the depth direction. Accordingly, reflection of incident ambient light can be further reduced. The installation of the anti-reflection layers 50, 60 and the anti-reflection structure 30 can further enhance inhibition of reflection of incident ambient light.

Figure 8A:
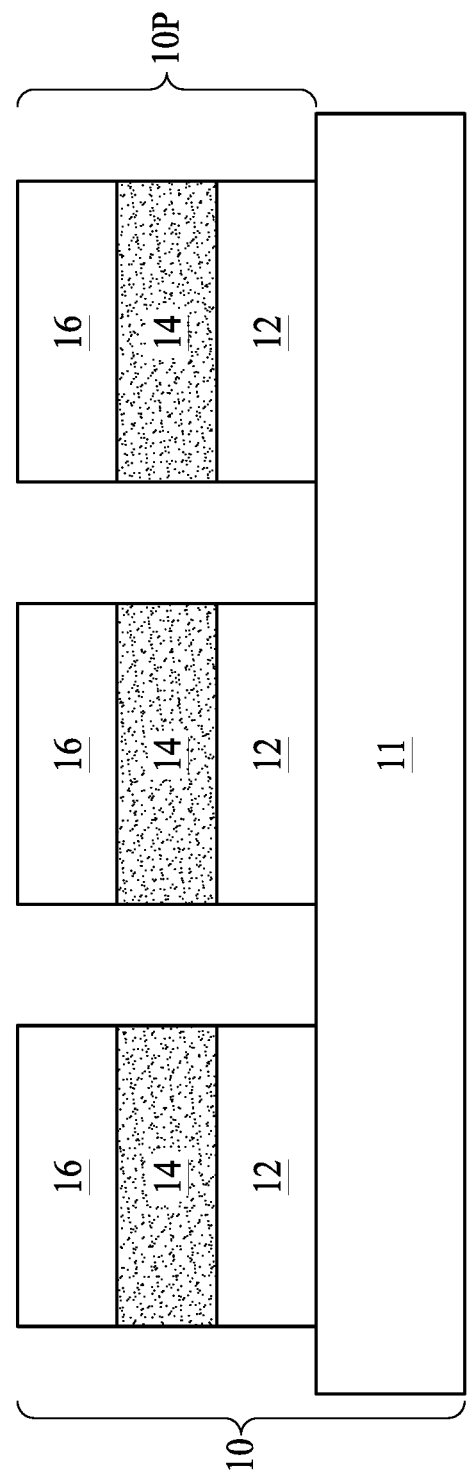
FIG. 8A, FIG. 8B, FIG. 8C, FIG. 8D and FIG. 8E are schematic diagrams illustrating a method for forming a display panel in accordance with some embodiments of the present disclosure.

FIG. 8A, FIG. 8B, FIG. 8C, FIG. 8D and FIG. 8E are schematic diagrams illustrating a method for forming a display panel in accordance with some embodiments of the present disclosure. As shown in FIG. 8A, a display device 10 such as an organic light-emitting diode (OLED) device is formed. In some embodiments, the display device 10 includes a plurality of pixels 10P, and each of the pixels 10P includes an organic light-emitting layer 14 formed over a substrate 11, and the organic light-emitting layer 14 has a glass transition temperature. In some embodiments, each of the pixels 10P may further include an anode 12 and a cathode 16 for driving the organic light-emitting layer 14.

Figure 8B:
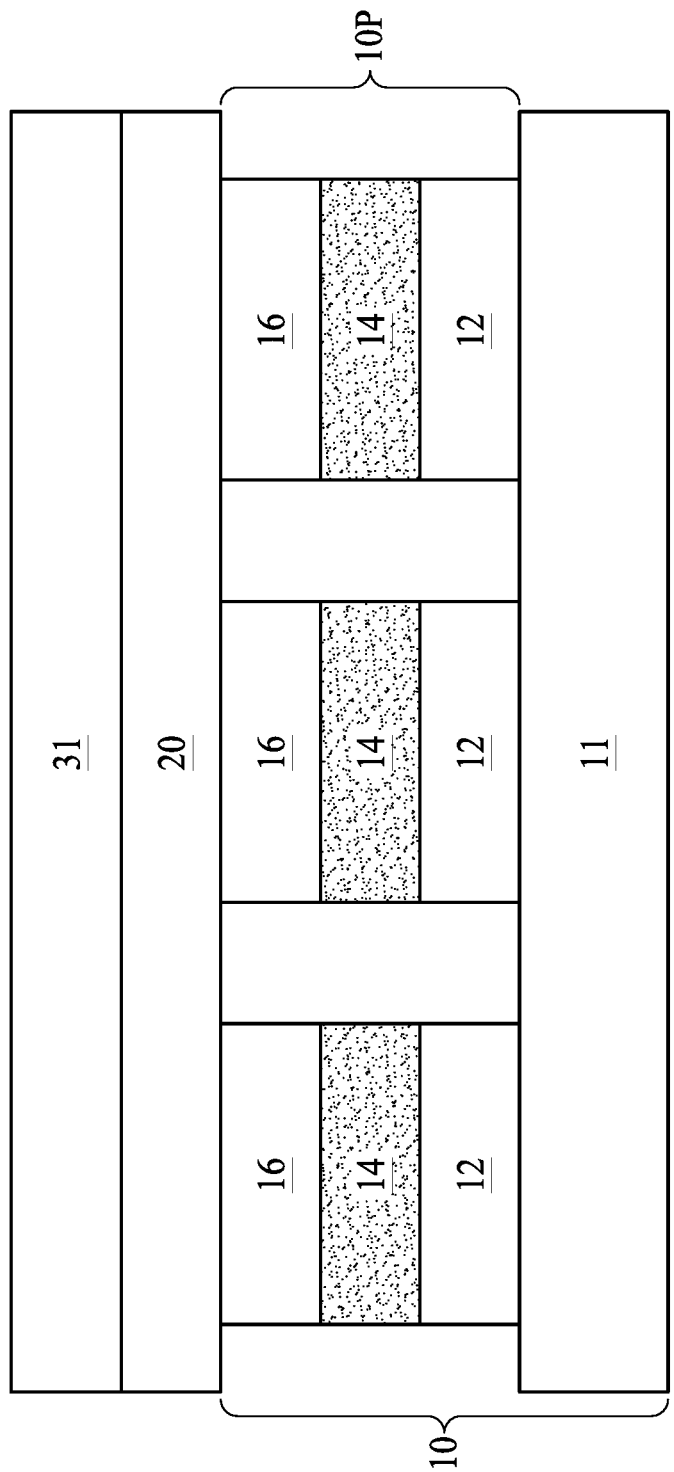

As shown in FIG. 8B, a photo-sensitive material 31 may be formed over the display device 10. In some embodiments, the photo-sensitive material 31 may be integrally formed over the display device 10 by coating, dispensing or other suitable methods. In some embodiments, the photo-sensitive material 31 may be formed from a photo-sensitive material such as a polyimide-based material, but not limited thereto. In some embodiments, an optical absorbing layer 20 may be optionally formed over the display device 10 prior to formation of the photo-sensitive material 31 over the display device 10. In some embodiments, a thermal treatment is performed to heat the photo-sensitive material 31 at a curing temperature to solidify the photo-sensitive material 31. The curing temperature of the photo-sensitive material 31 is lower than the glass transition temperature of the organic light-emitting layer 14. In some embodiments, the curing temperature of the photo-sensitive material 31 is substantially lower than 110° C., such as between about 50° C. and about 80° C., but not limited thereto.

Figure 8C:
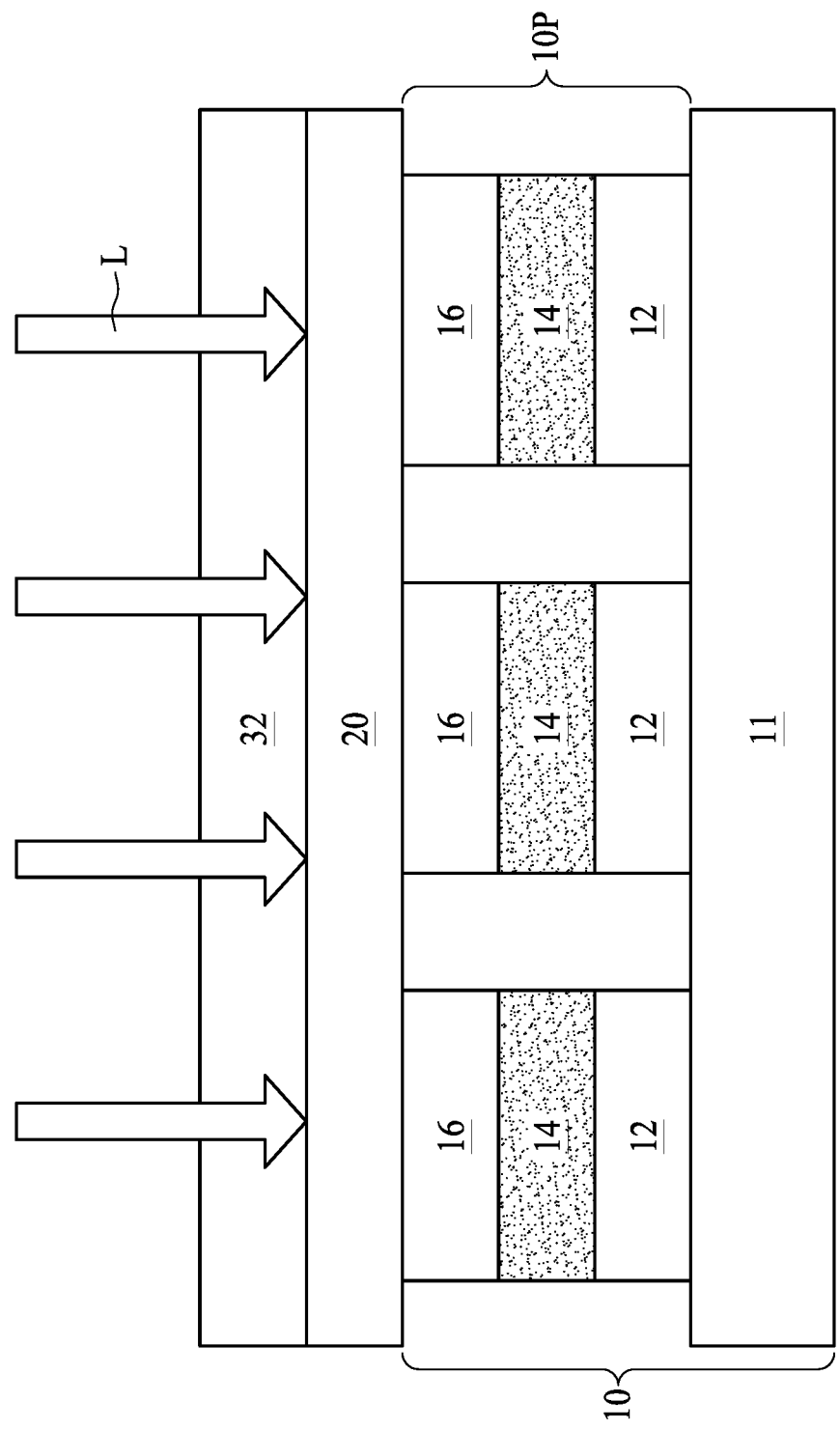

As shown in FIG. 8C, the photo-sensitive material 31 is irradiated with a light L to form a photo-sensitive alignment layer 32. In some embodiments, the light L for curing the photo-sensitive material 31 is a linear polarizing invisible light such as a linear polarizing UV light having a wavelength range substantially between 200 nm and 400 nm, but not limited thereto. In some embodiments, the material of the photo-sensitive material 31 may be decomposed after irradiation of the light L. In some embodiments, the optical absorbing layer 20 is configured to absorb the light L and prevent the display device 10, particularly the organic light-emitting layers 14, from being damaged by exposure to the light L. The optical absorbing layer 20 allows the light emitted by the display device 10 to pass such that display images of the display device 10 are not affected. In some embodiments, the thermal treatment may be performed prior to and/or subsequent to the irradiation of the photo-sensitive material 31.

Figure 8D:
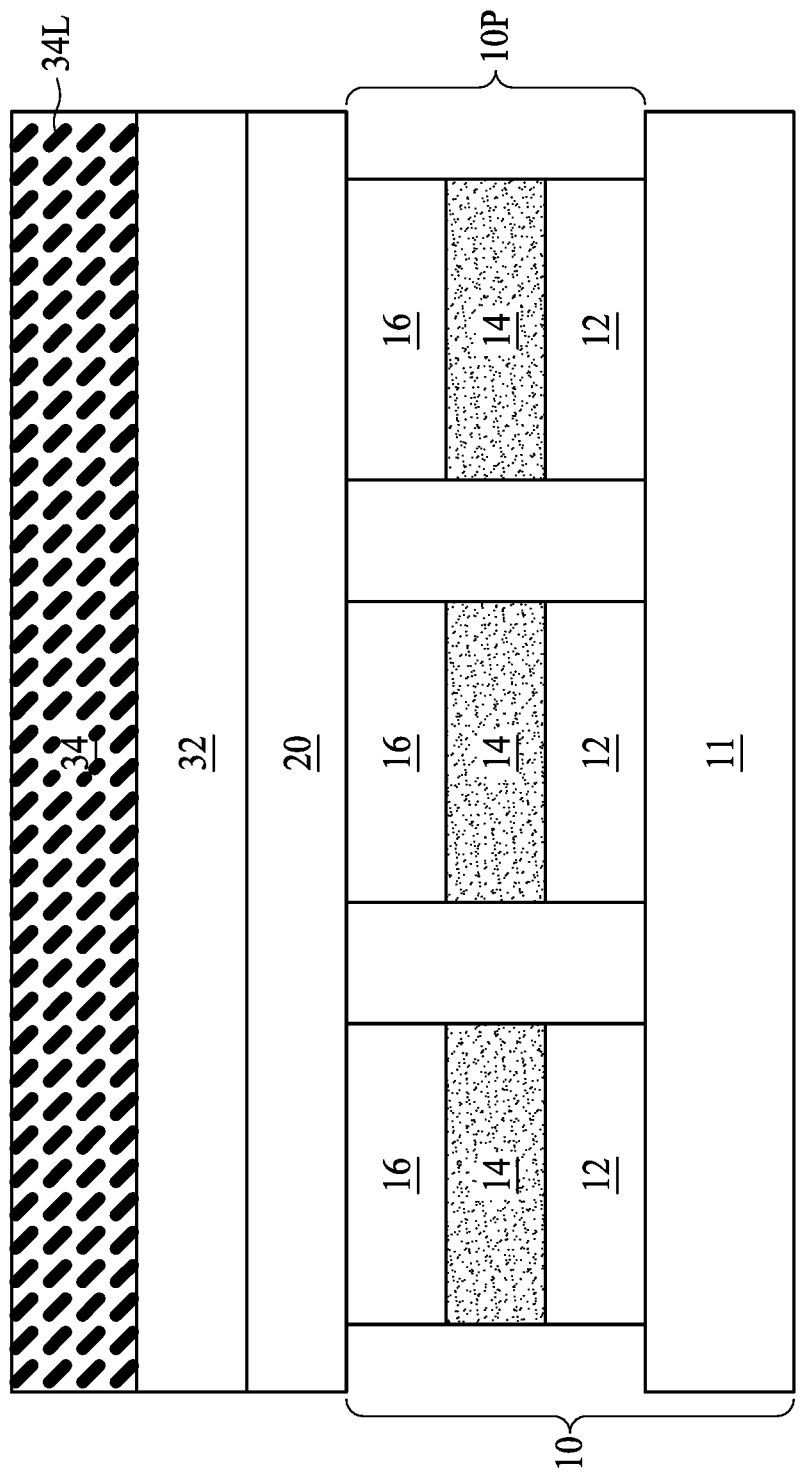

As shown in FIG. 8D, a plurality of liquid crystal molecules 34L may be integrally formed over the photo-sensitive alignment layer 32 by coating, dispensing or other suitable methods. The liquid crystal molecules 34L may be bonded to the decomposed material of the photo-sensitive material 31 such as by Van der waals force, and aligned by the photo-sensitive alignment layer 32 to form a liquid crystal circular polarizer 34 with phase retardation effect. In some embodiments, the liquid crystal circular polarizer 34 has ¼ wavelength retardation effect, and is configured as a circular polarizer. In contrast to a mechanical alignment such as rubbing process which may cause damage to the display device 10 or underlying layers, the display device 10 or underlying layers is less likely to be damaged during the optical alignment, and thus the reliability of the display panel can be increased.

Figure 8E:
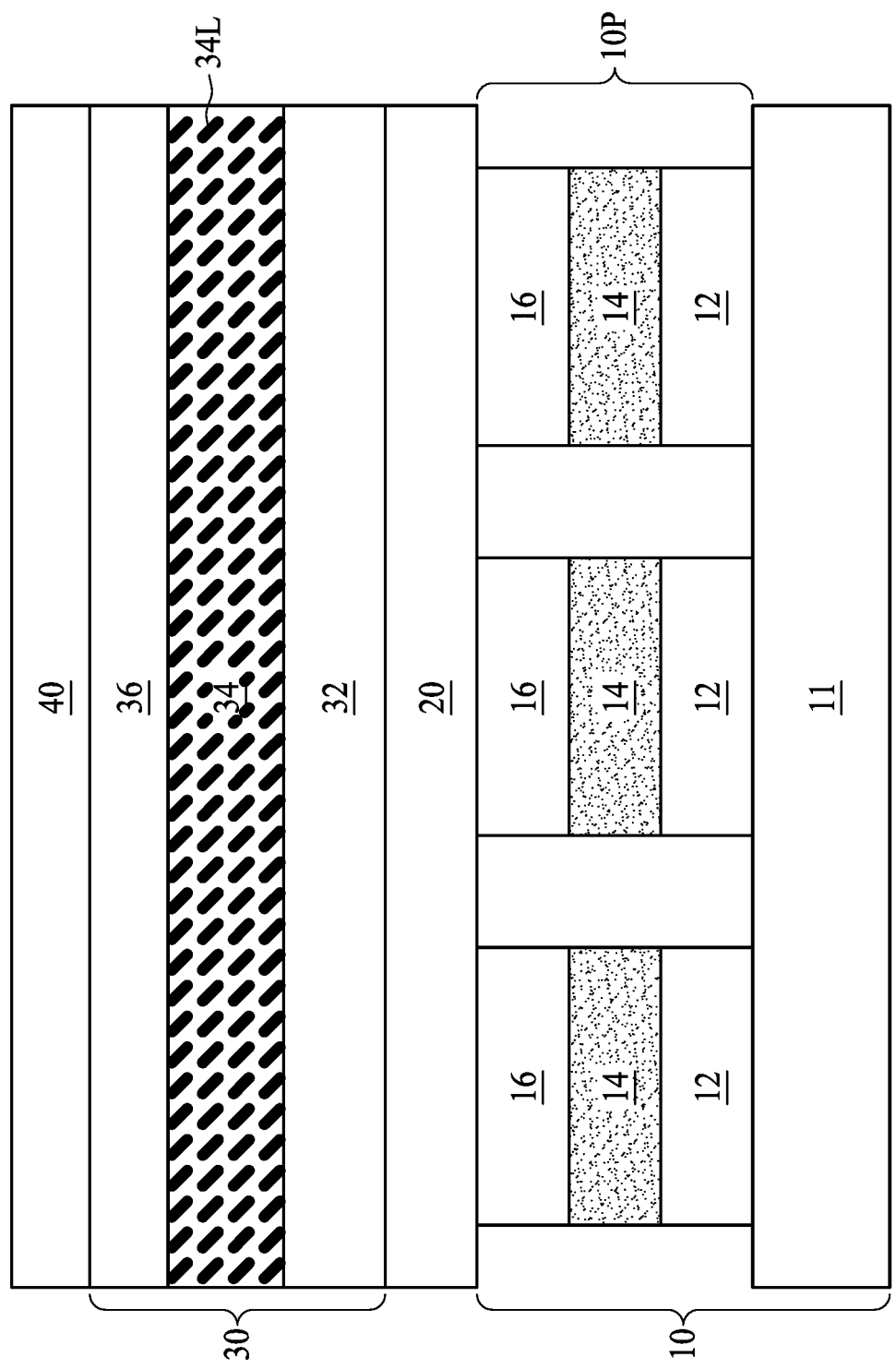

As shown in FIG. 8E, a linear polarizer 36 may be integrally formed over the liquid crystal circular polarizer 34 by coating, dispending, depositing or other suitable methods. The photo-sensitive alignment layer 32, the liquid crystal circular polarizer 34 and the linear polarizer 36 form an anti-reflection structure 30 able to inhibit reflection of incident ambient light. In some embodiments, a cover layer 40 is formed over the linear polarizer 36 to protect the linear polarizer 36.

In some embodiments of the present disclosure, a display panel such as an OLED display panel is equipped with an integrally-formed anti-reflection structure. The integrally-formed anti-reflection structure can be directly formed on the display surface of the display panel without damaging the display device such as OLED device and without requiring additional adhesive layers, and thus can save manufacturing costs and minimize the overall thickness of the display panel. The integrally-formed anti-reflection structure can inhibit reflection of incident light from the environment, and thus can increase visibility and contrast ratio in outdoor use. The anti-reflection structure and other functional layers such as the TFE, the optical absorbing layer, the touch input device, the anti-reflection layer and the cover layer are formed from extendable material, and may be formed directly over the display device without requiring additional adhesive layers. Accordingly, adhesion between any two adjacent layers of the above layers is enhanced. The enhanced adhesion reduces the risk of delamination of the display panel, especially when the display panel is operated in a bent or folded mode.

Figure 9:
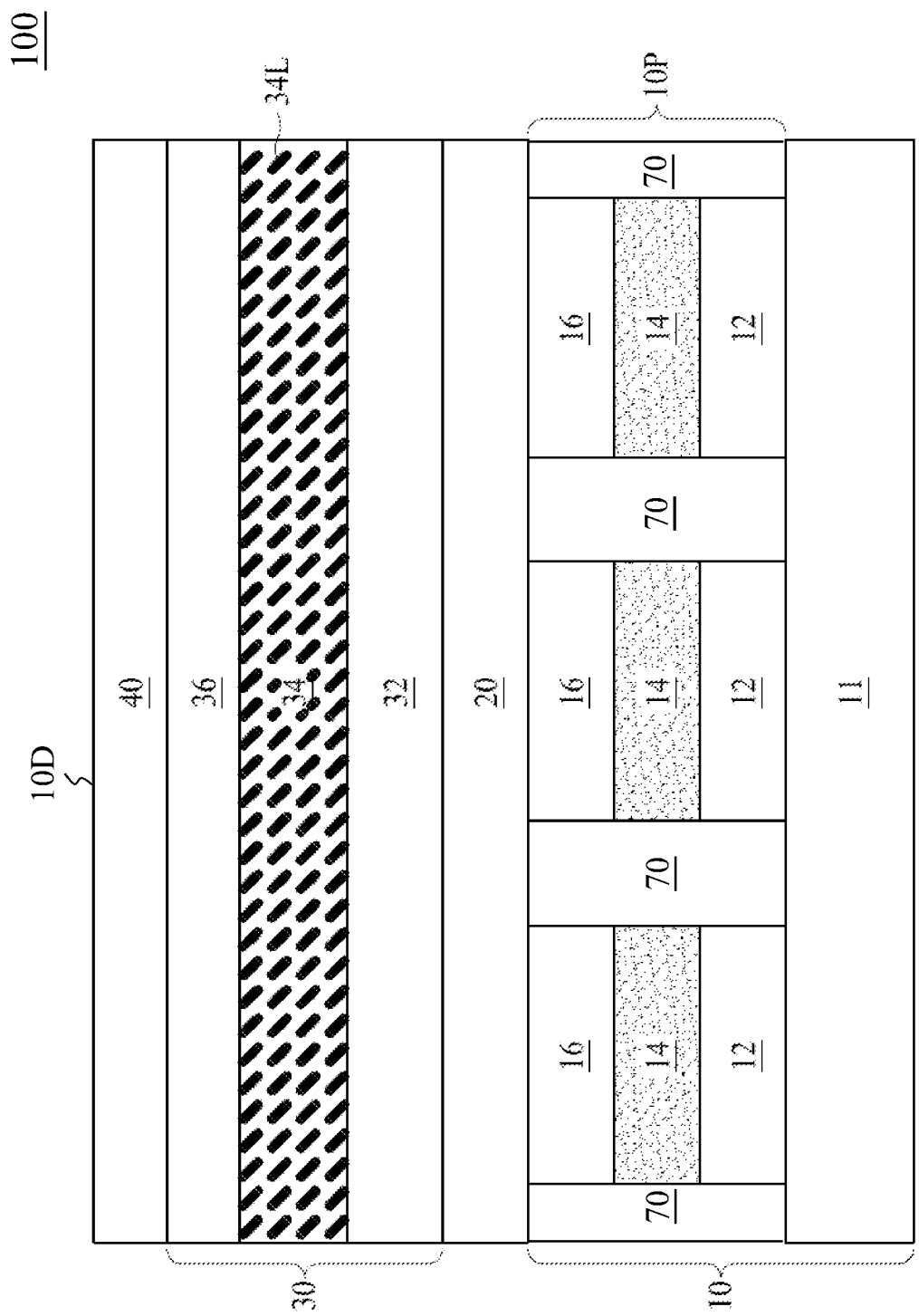
FIG. 9 is a schematic diagram of a display panel in accordance with some embodiments of the present disclosure.

Other alternatives or embodiments may be used without departure from the spirit and scope of the present disclosure. FIG. 9 is a schematic diagram of a display panel in accordance with some embodiments of the present disclosure. As shown in FIG. 9, a light-guiding structure 70 is disposed between the pixels 10P to guide light beams emitted from the pixels 10P toward the display surface 10D of the display panel 100. Typically, light beams emitted from the pixels 10P are multi-directional and isotropic. Thus, lateral lights beams generated from the pixels 10P are often wasted since they are more unlikely to pass through the display surface. The light-guiding structure 70 is incorporated into the display panel 100 to increase the amount of light beams to travel toward the display device. Lateral light beams emitted from the pixels 10P may be redirected toward the display surface 10D by the light-guiding structure 70.

In some embodiments, a refractive index of the light-guiding structure 70 is smaller than that of the pixels 10P. Accordingly, the lateral light beams emitted from the pixels 10P may be reflected by the light-guiding structure 70 without entering the light-guiding structure 70. The lateral light beams emitted from the pixels 10P are redirected to the display surface 10D by total internal reflection. In some embodiments, the light-guiding structure 70 includes a pixel-defining layer (PDL). Though not shown in the figures, the display panel 100 may further include an anti-reflection layer 50 between the display device 10 and the cover layer 40 as shown in FIG. 5, but is not limited thereto.

The light-guiding structure 70 can be formed in different shapes. As shown in FIG. 9, the cross section of the light-guiding structure 70 may be rectangle. In some embodiments, the cross section of the light-guiding structure 70 may have a curved surface. In other embodiments, the shape of light-guiding structure 70 may be a trapezoid. The shape of the light-guiding structure 70 may be altered according to the design or other considerations.

Figure 10:
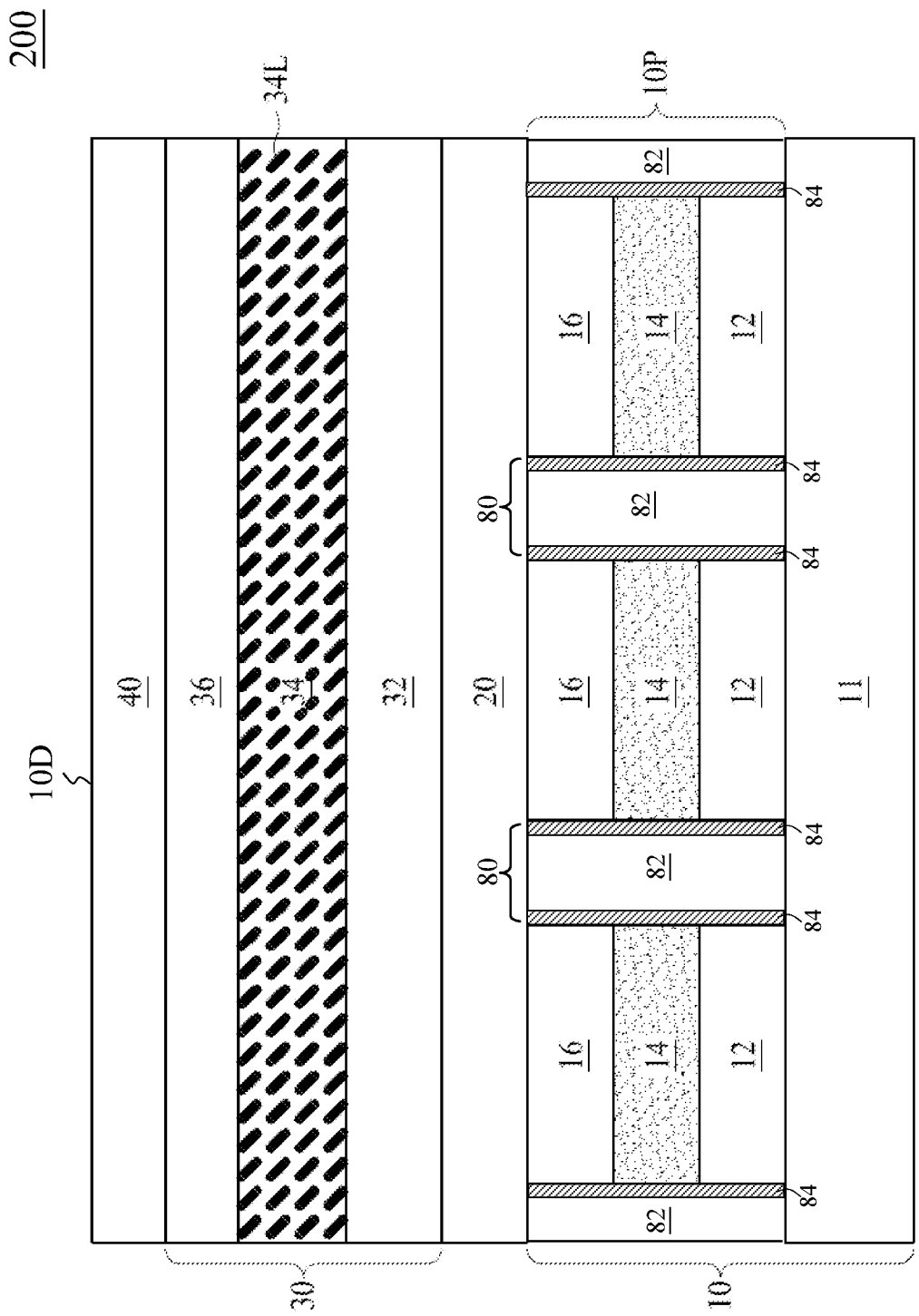
FIG. 10 is a schematic diagram of a display panel in accordance with some embodiments of the present disclosure.

FIG. 10 is a schematic diagram of a display panel in accordance with some embodiments of the present disclosure. As shown in FIG. 10, the light-guiding structure 80 of the display panel 200 includes a PDL 82 and a reflective film 84. The reflective film 84 is disposed on surfaces of the PDL 82 facing the pixels 10P to reflect the lateral light beams emitted from the pixels 10P to the display surface 10D of the display panel 200. In some embodiments, the reflective film 84 is affixed to surfaces of the PDL 80 facing the pixels 10P. The reflective film 84 may include metal oxides. In some embodiments, the reflective film 84 may assist lift-off processes of red, green and blue materials through a photosensitive layer. The display panel 200 may further include an anti-reflection layer 50 as shown in FIG. 5, but is not limited thereto.

The PDL 82 can be formed in different shapes. As shown in FIG. 10, the cross section of the PDL 82 is rectangle. In some embodiments, the cross section of the PDL 82 may have a curved surface. In other embodiments, the shape of PDL 82 may be a trapezoid. The shape of the PDL 82 may be altered according to the design or other considerations.

Figure 11:
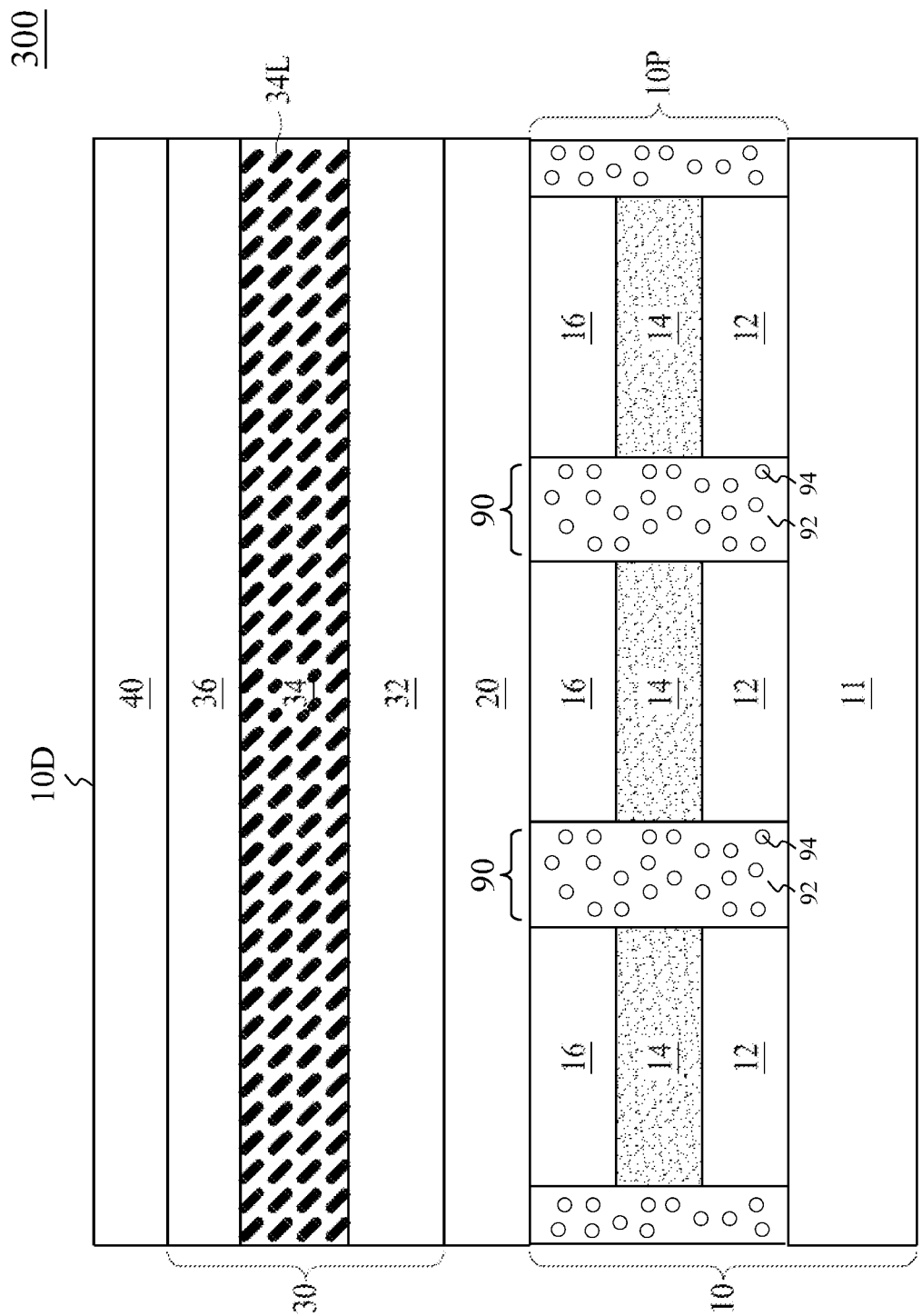
FIG. 11 is a schematic diagram of a display panel in accordance with some embodiments of the present disclosure.

FIG. 11 is a schematic diagram of a display panel in accordance with some embodiments of the present disclosure. As shown in FIG. 11, the light-guiding to structure 90 of the display panel 300 includes a PDL 92 and a plurality of scattering particles 94 dispersed in the PDL 92. The scattering particles 94 are configured to scatter the lateral light beams emitted from the pixels 10P to the display surface 10D of the display panel 300. In some embodiments, the scattering particles 94 are randomly dispersed in the PDL 92. The lateral light beams may travel through the light-guiding structure 90 and encounter the scattering particles 94. The scattering particles 94 may scatter the lateral light beams such that the lateral light beams emitted from the pixels 10P are substantially toward the display surface.

The scattering particles 94 may include conductive particles. In some embodiments, the conductive particles include metal oxide particles. The dimension of the metal oxide particles may be in nanoscale. The metal oxide particles may increase the optical out-coupling by scattering the lateral light beams emitted from the pixels 10P. In some embodiments, the metal oxide particles may assist the removing of the photoresists during the lift-off process in the manufacturing process for the display panel 300. In other embodiments, the scattering particles 94 may include insulation particles. The display panel 300 may further include an anti-reflection layer 50 as shown in FIG. 5, but is not limited thereto.

Figure 12:
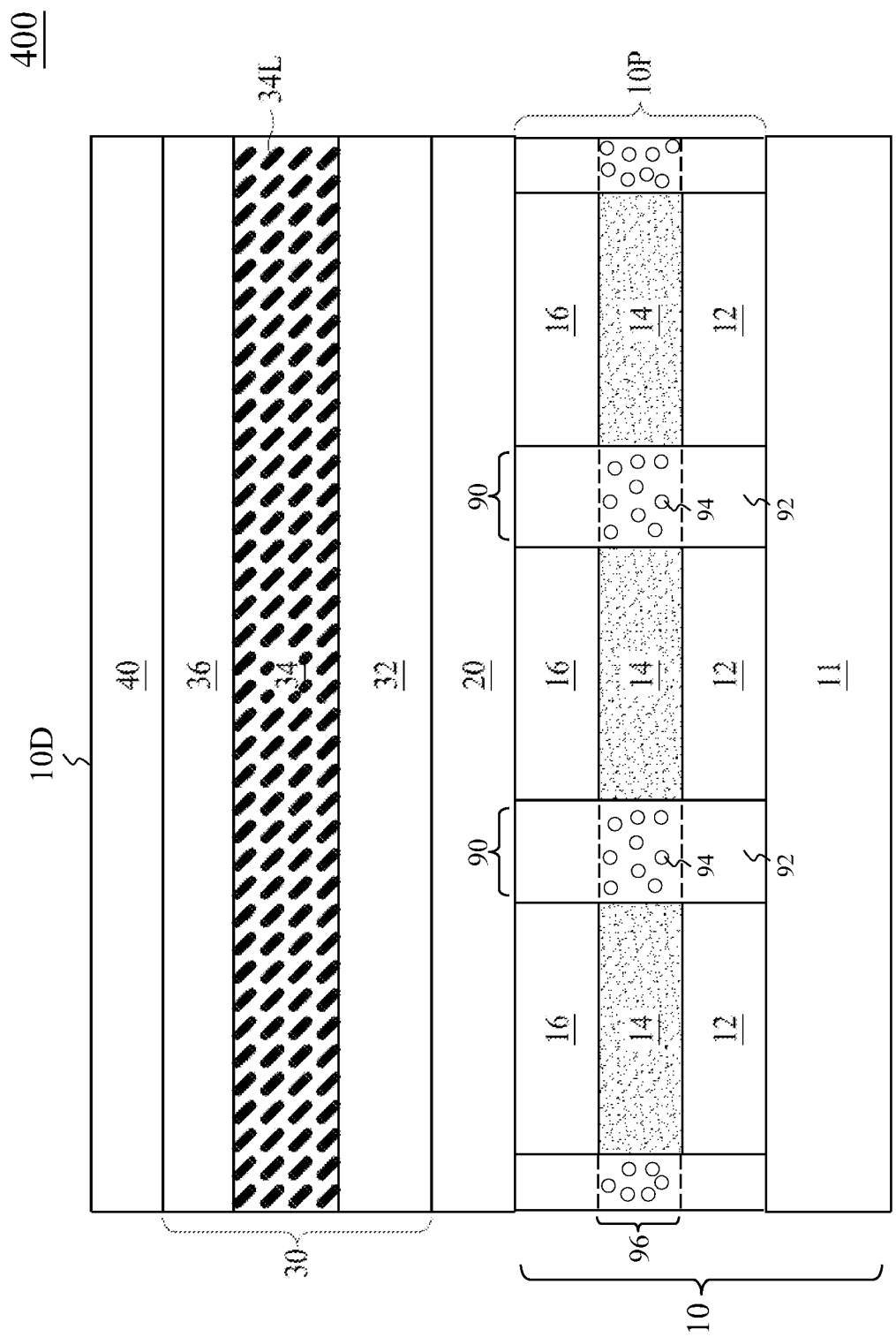
FIG. 12 is a schematic diagram of a display panel accordance with some embodiments of the present disclosure.

FIG. 12 is a schematic diagram of a display panel in accordance with some embodiments of the present disclosure. In contrast to the embodiment shown in FIG. 11, the scattering particles 94 of the display panel 400 in FIG. 12 are dispersed in the PDL 92 corresponding to the organic light-emitting layer 14. The scattering particles 94 are doped in a confined region 96 corresponding to the area of the organic light-emitting layer 14. The scattering particles 94 are arranged corresponding to the organic light-emitting layer 14 such that the lateral light beams emitted from the organic light-emitting layer 14 may be effectively scatter by the light-guiding structure 90. The display panel 400 may further include an anti-reflection layer 50 as shown in FIG. 5, but is not limited thereto.

Figure 13:
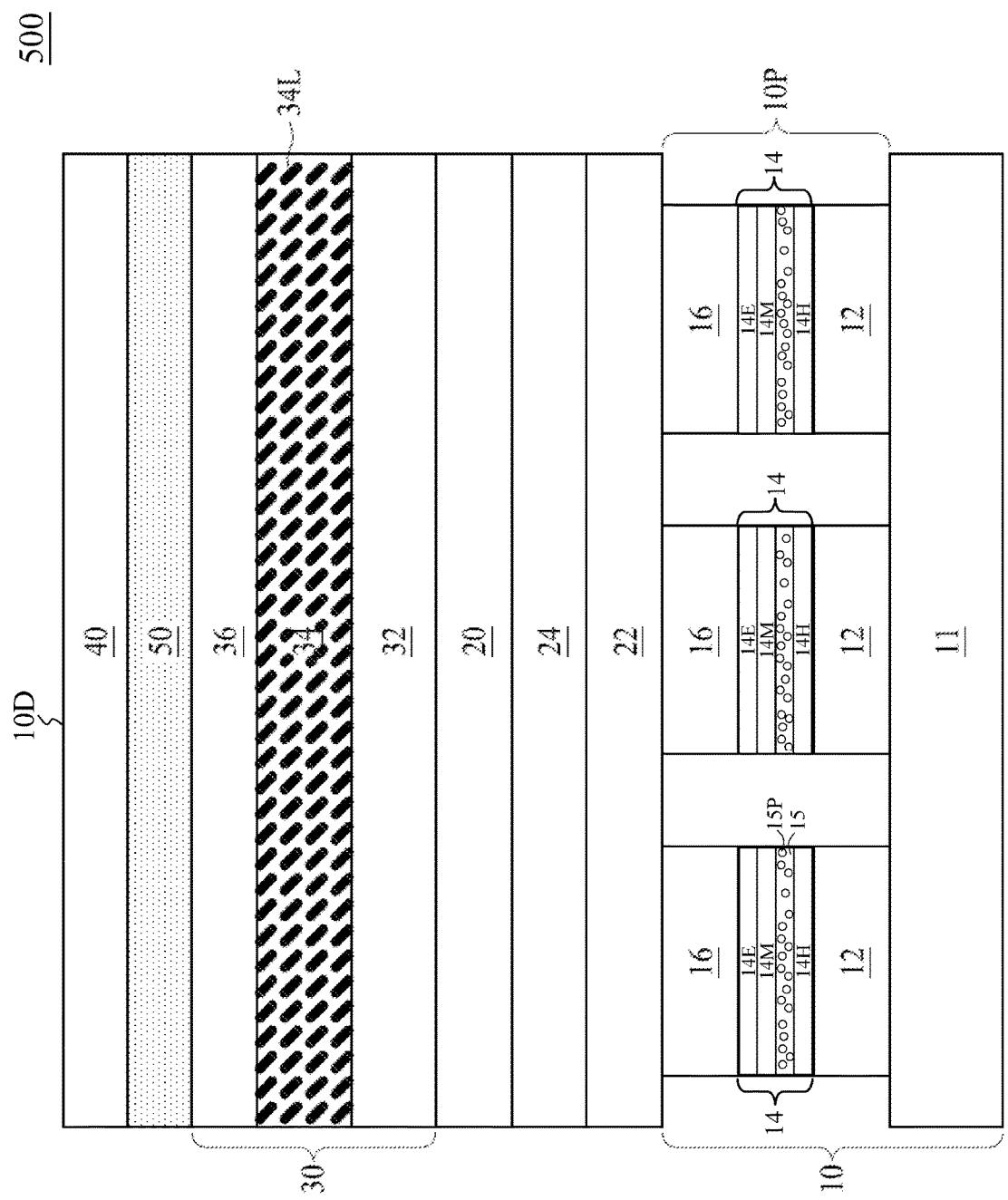
FIG. 13 is a schematic diagram of a display panel in accordance with some embodiments of the present disclosure.

FIG. 13 is a schematic diagram of a display panel in accordance with some embodiments of the present disclosure. As shown in FIG. 13, each of the pixels 10P of the display panel 500 includes a plurality of layers stacked together. In some embodiments, the organic light-emitting layer 14 may include a first carrier layer 14H, a light-emitting layer 14M and a second carrier layer 14E. The first carrier layer 14H may include a first carrier injection layer and a first carrier transportation layer. The second carrier layer 14E may include a second carrier injection layer and a second carrier transportation layer. In some embodiments, the first carrier is hole and the second carrier is electron.

Referring to FIG. 13, a light-guiding structure 15 and the plurality of layers are stacked on one another. The light-guiding structure 15 is between the first carrier layer 14H and the light-emitting layer 14M. The light-guiding structure 15 may include a plurality of scattering particles 15P for scattering light beams emitted from the pixels 10P. The scattering particles 15P may include conductive particles. In some embodiments, the conductive particles include metal oxide particles. The metal oxide particles may increase the optical out-coupling by scattering the light beams emitted from the pixels 10P. Specifically, light beams travel toward the first carrier layer 14 may be scattered by the scattering particles 15P in the light-guiding structure 15. Thus, the light beams may be redirected and travel towards the display surface 10D of the display panel 500.

Figure 14:
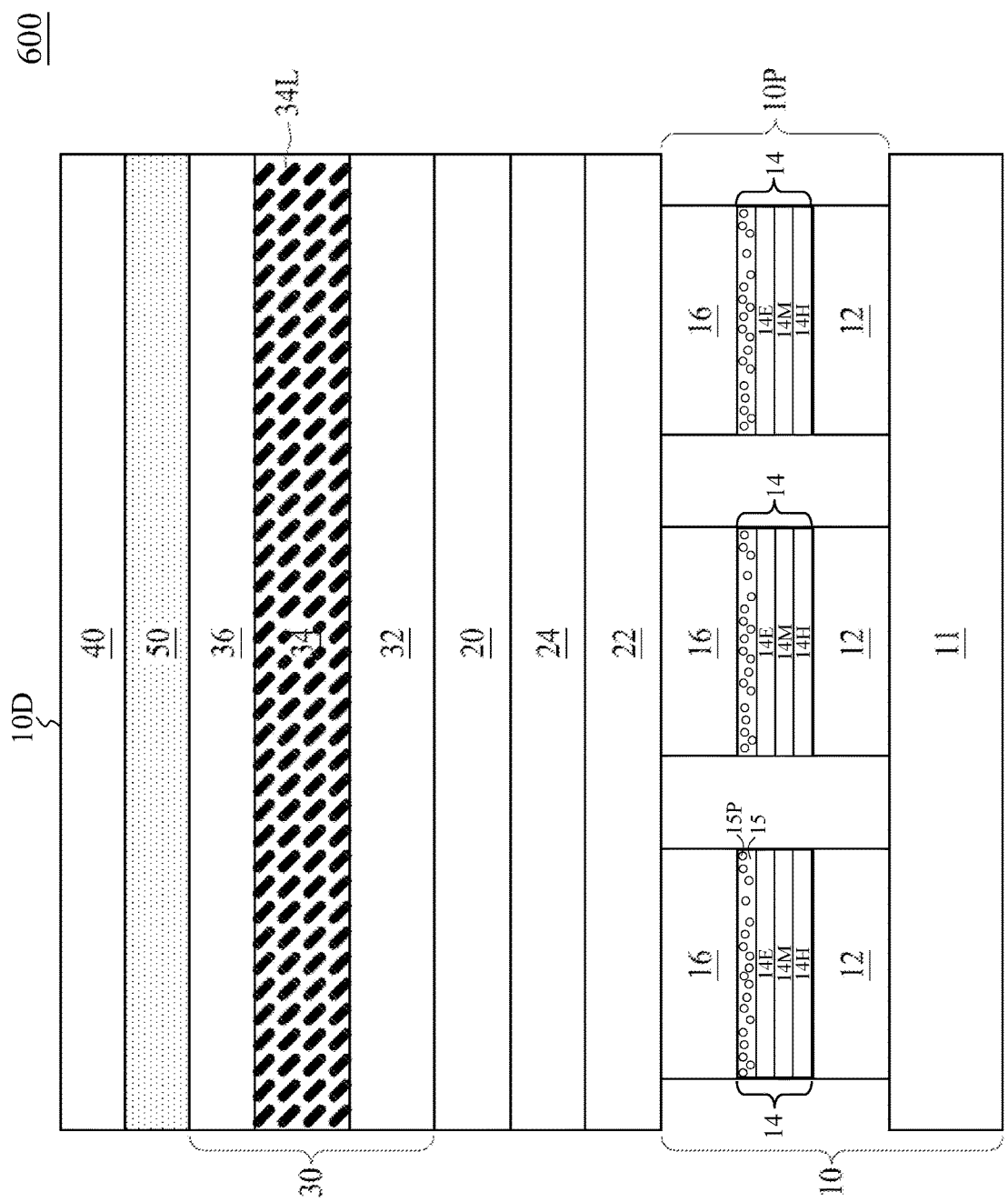
FIG. 14 is a schematic diagram of a display panel in accordance with some embodiments of the present disclosure.

FIG. 14 is a schematic diagram of a display panel in accordance with some embodiments of the present disclosure. As shown in FIG. 14, the light-guiding structure 15 of the display panel 600 is between the second carrier layer 14E and the cathode 16. The light-guiding structure 15 may include a plurality of scattering particles 15P for scattering light beams emitted from the pixels 10P or scattering incident ambient light. The installation of the light-guiding structure 15 can further enhance inhibition of reflection of incident ambient light and increase the optical out-coupling from the pixels 10P.

Figure 15:
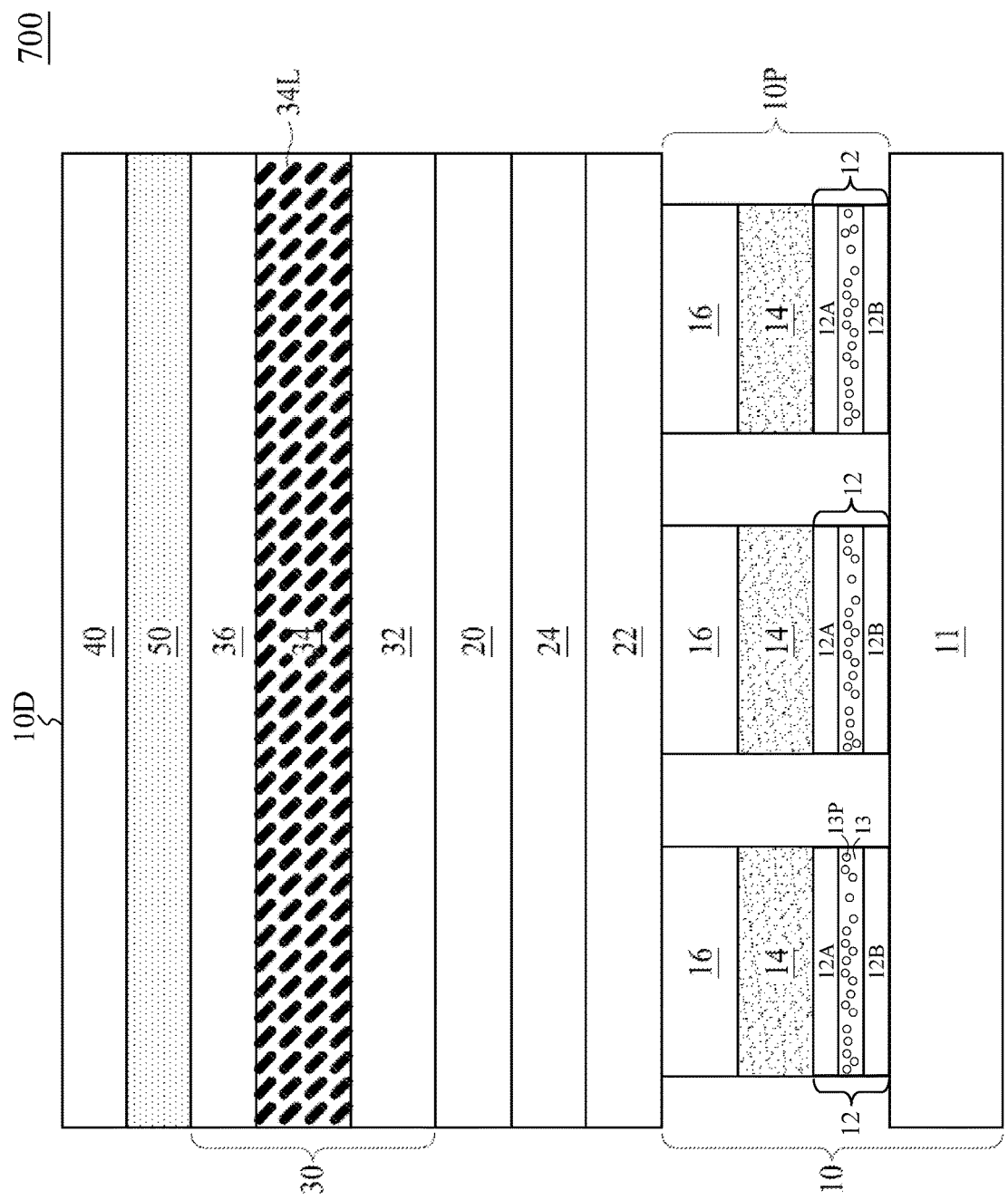
FIG. 15 is a schematic diagram of a display panel in accordance with some embodiments of the present disclosure.

FIG. 15 is a schematic diagram of a display panel in accordance with some embodiments of the present disclosure. As shown in FIG. 15, the anode 12 of the display panel 700 may include at least two sublayers 12A and 12B. The light-guiding structure 13 is between the sublayer 12A and the sublayer 12B. The light-guiding structure 13 may include a plurality of scattering particles 13P for scattering light beams emitted from the pixels 10P. Specifically, light beams travel toward the substrate 11 may be scattered by the scattering particles 13P in the light-guiding structure 13. Thus, the light beams may be redirected and travel towards the display surface 10D of the display panel 700.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display panel, comprising:
a display device comprising a plurality of pixels;
a light-guiding structure for scattering lateral light beams emitted from the pixels substantially toward a display surface;
an anti-reflection structure over the pixels of the display device;
a cover layer over the anti-reflection structure; and
at least one anti-reflection layer between the display device and the cover layer, wherein the anti-reflection layer comprises a structural layer including a plurality of protrusion structures and an optical layer in contact with the structural layer, a surface of the optical layer is engaged with the protrusion structures, and a refractive index of the optical layer is smaller than a refractive index of the structural layer.

2. The display panel in claim 1, further comprising a pixel-defining layer (PDL).

3. The display panel in claim 2, wherein the light-guiding structure comprises a plurality of scattering particles dispersed in the PDL.

4. The display panel in claim 3, wherein the scattering particles comprise metal oxide particles.

5. The display panel in claim 2, wherein the light-guiding structure comprises a reflective film affixed to surfaces of the PDL facing the pixels.

6. The display panel in claim 1, wherein a refractive index of the light-guiding structure is smaller than that of the pixels, and the lateral light beams emitted from the pixels are reflected by the light-guiding structure without entering the light-guiding structure.

* * * * *